United States Patent
Komura

(10) Patent No.: US 7,650,553 B2
(45) Date of Patent: Jan. 19, 2010

(54) SEMICONDUCTOR INTEGRATED CIRCUIT APPARATUS AND INTERFACE TEST METHOD

(75) Inventor: Kazufumi Komura, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/319,515

(22) Filed: Dec. 29, 2005

(65) Prior Publication Data

US 2007/0079198 A1 Apr. 5, 2007

(30) Foreign Application Priority Data

Sep. 30, 2005 (JP) ............................. 2005-288824

(51) Int. Cl.
*G01R 31/28* (2006.01)

(52) U.S. Cl. ........................... 714/733; 714/30; 714/43; 714/44; 714/712; 714/715; 714/716; 714/717; 714/718; 714/724; 714/728; 714/734; 714/735; 714/738; 714/739; 714/741; 702/117; 703/23; 703/24; 703/25; 703/19; 703/15; 710/106

(58) Field of Classification Search ........................ None
See application file for complete search history.

(56) References Cited

U.S. PATENT DOCUMENTS

| | | | | |
|---|---|---|---|---|
| 5,214,655 A | * | 5/1993 | Eichelberger et al. | ........ 714/733 |
| 5,239,536 A | * | 8/1993 | Masuko et al. | ............... 370/249 |
| 5,802,073 A | * | 9/1998 | Platt | ........................... 714/733 |
| 5,956,370 A | * | 9/1999 | Ducaroir et al. | ............. 375/221 |
| 6,415,393 B2 | | 7/2002 | Satoh | |
| 6,760,873 B1 | * | 7/2004 | Hao et al. | ..................... 714/724 |
| 6,928,597 B2 | * | 8/2005 | Kuegler et al. | .............. 714/724 |
| 6,944,692 B2 | * | 9/2005 | Smith et al. | ................. 710/106 |
| 7,111,208 B2 | * | 9/2006 | Hoang et al. | ................. 714/716 |
| 7,127,648 B2 | * | 10/2006 | Jiang et al. | .................... 714/715 |
| 7,218,861 B2 | * | 5/2007 | Totsuka et al. | .............. 398/135 |
| 2003/0101376 A1 | * | 5/2003 | Sanghani | ..................... 714/30 |
| 2003/0149921 A1 | * | 8/2003 | Lau et al. | ..................... 714/704 |
| 2006/0080058 A1 | * | 4/2006 | Zimmerman et al. | ........ 702/117 |

FOREIGN PATENT DOCUMENTS

| | | |
|---|---|---|
| JP | 62-064139 | 3/1987 |
| JP | 11-039189 | 2/1999 |
| JP | 11-143790 A | 5/1999 |
| JP | 2001-060177 A | 3/2001 |
| JP | 2001-308883 A | 11/2001 |
| JP | 2003-045199 | 2/2003 |
| JP | 2003-167034 A | 6/2003 |
| JP | 3446124 B2 | 9/2003 |
| JP | 3450274 B2 | 9/2003 |

* cited by examiner

*Primary Examiner*—John P Trimmings
(74) *Attorney, Agent, or Firm*—Arent Fox LLP

(57) ABSTRACT

An interface test can be performed by, for example, only a self apparatus when interface operation specifications are different between the self apparatus and an original connection partner apparatus. An LSI has a plurality of interfaces (IFs) for transmission/reception of data with an external device, and the LSI includes an emulation control unit for allowing one of the two of the plurality of IFs to perform an operation of emulating an IF of a connection partner device having operation specifications different from those of the LSI, when two IFs are connected to each other via a transmission line.

15 Claims, 22 Drawing Sheets

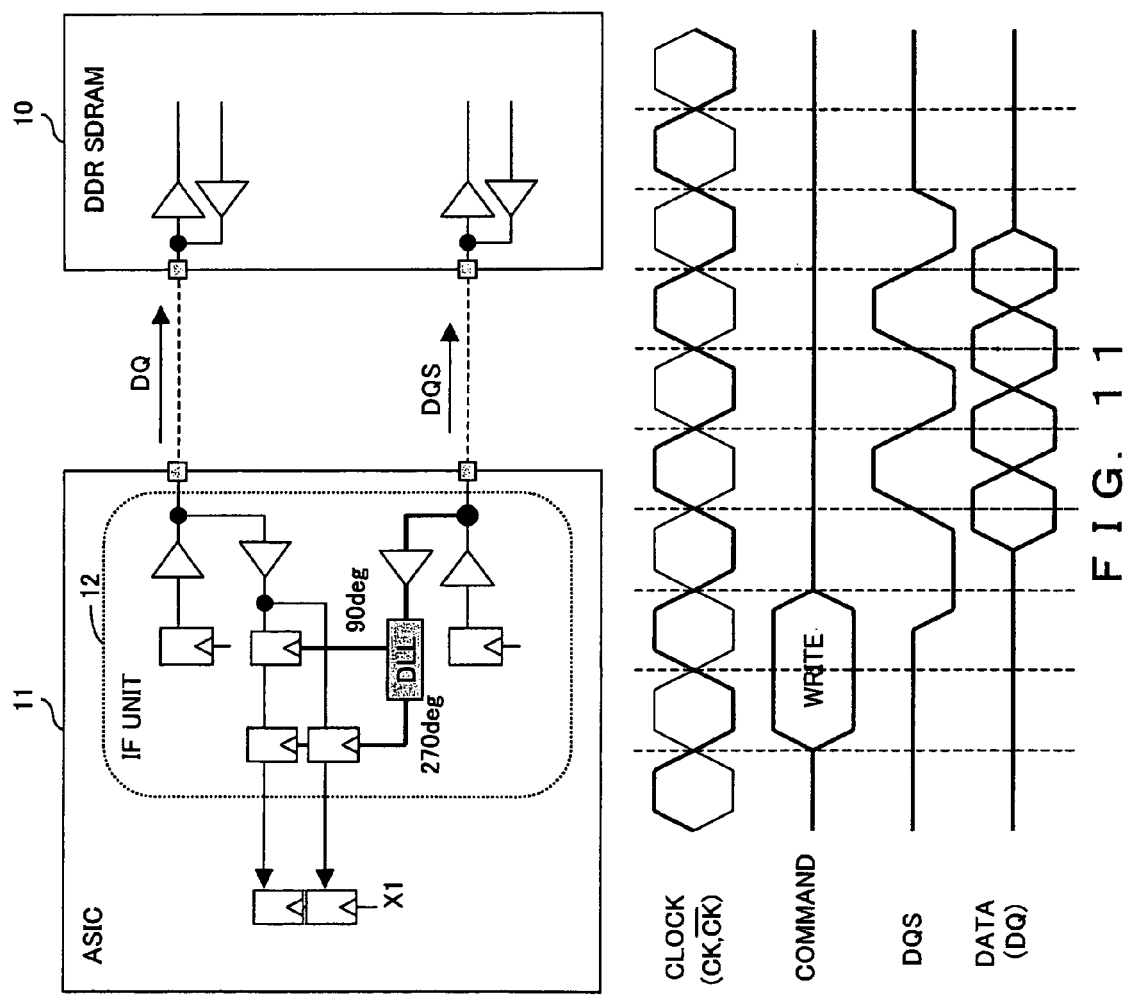

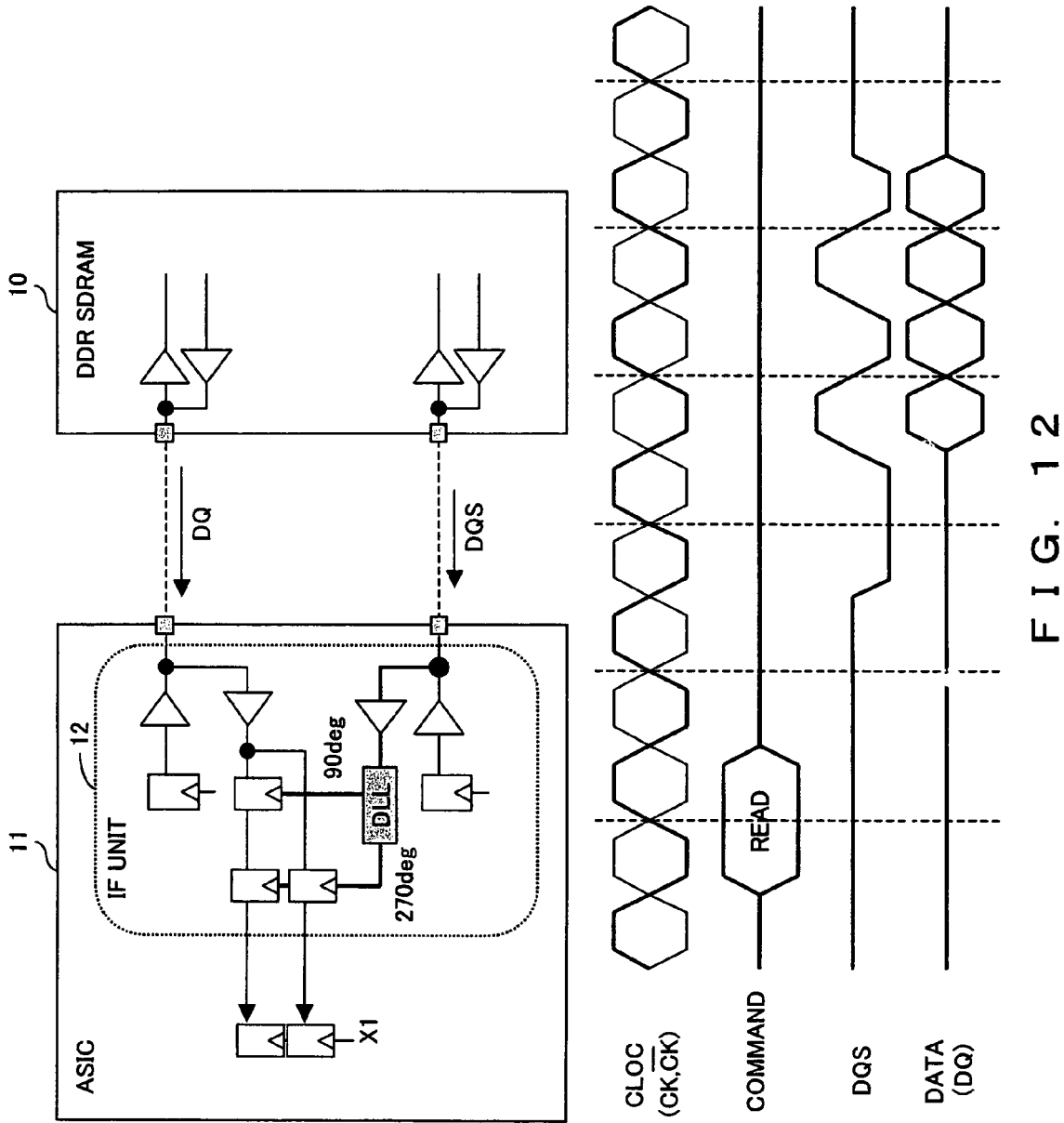

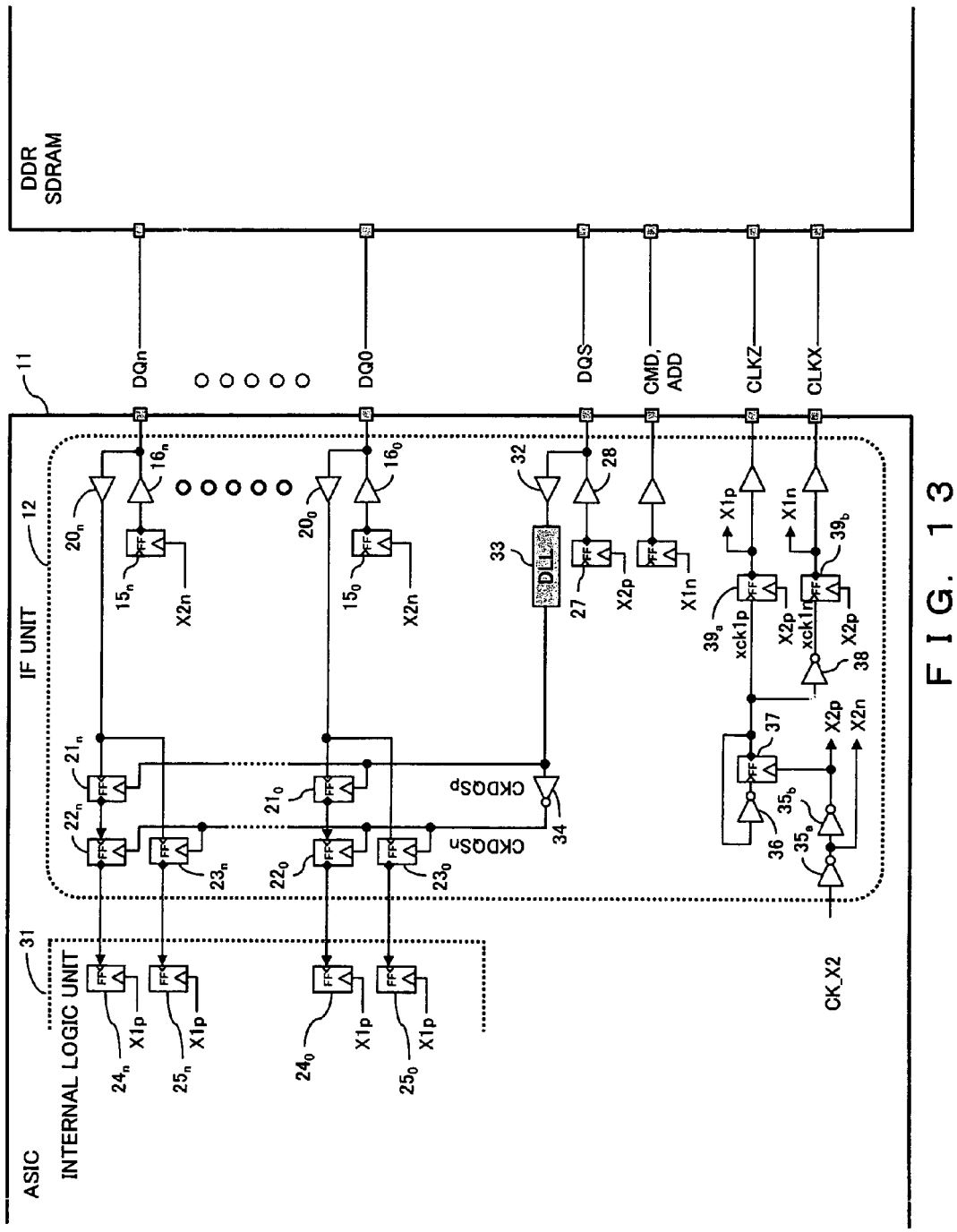
F I G. 1 3

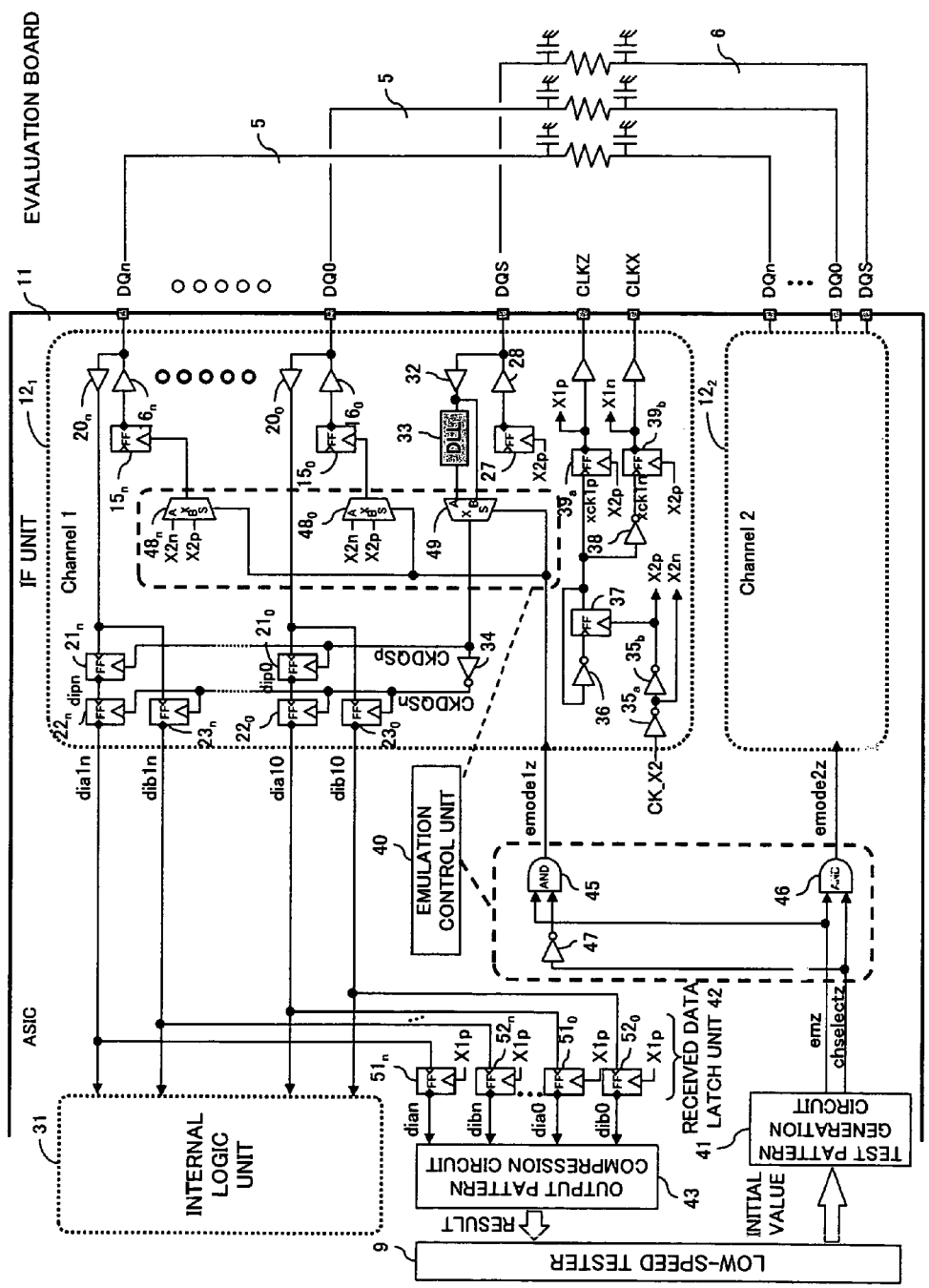
F I G. 15

| emz | emode1z | emode2z | wrz | ct1 | ct2 |
|---|---|---|---|---|---|
| 0 | x | x | x | c1 from Core | c2 from Core |
| 1 | 1 | 0 | 0 | 1 | 0 |
|   |   |   | 1 | 0 | 1 |
|   | 0 | 1 | 0 | 0 | 1 |
|   |   |   | 1 | 1 | 0 |

FIG. 19

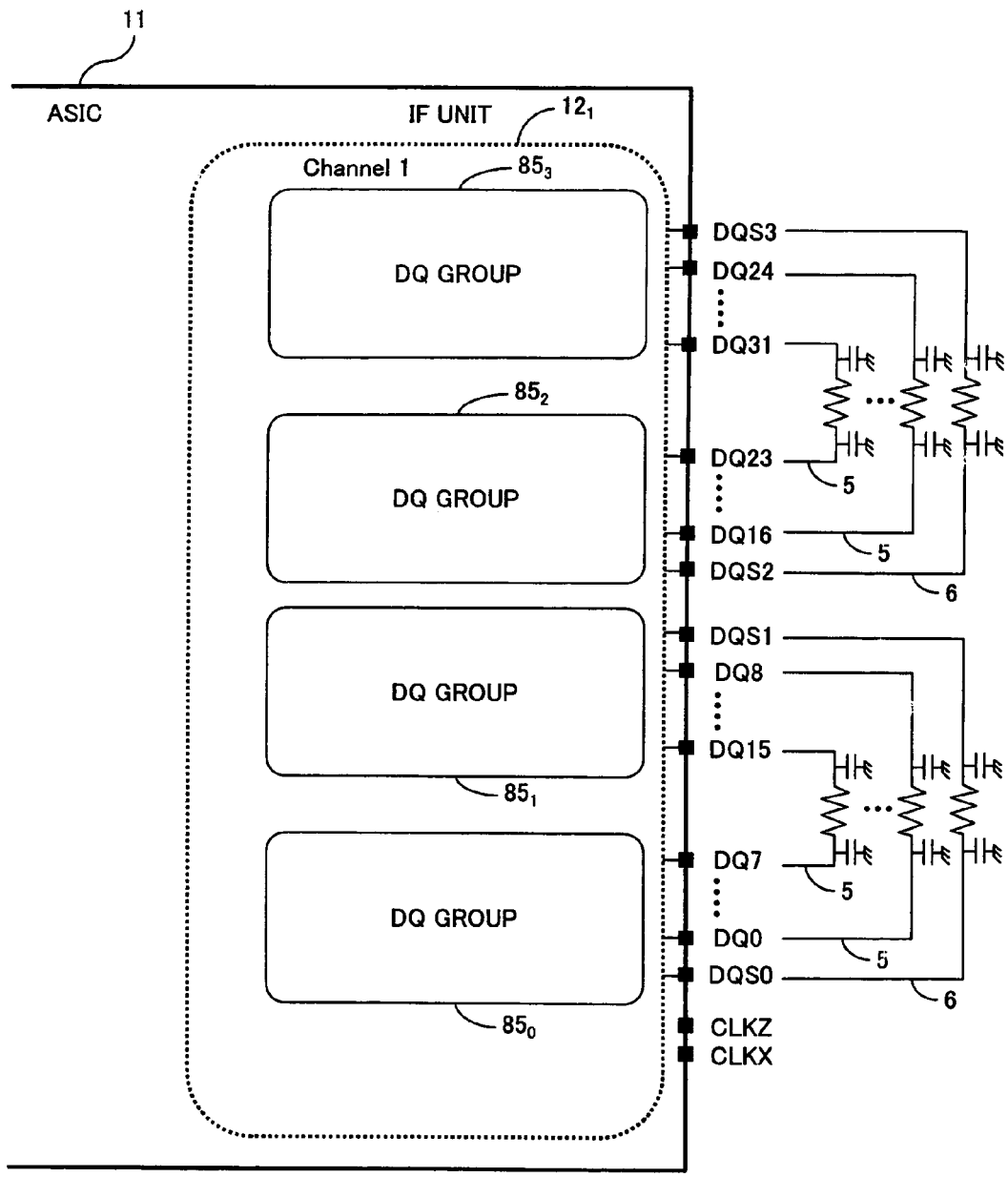
F I G. 2 2

SEMICONDUCTOR INTEGRATED CIRCUIT APPARATUS AND INTERFACE TEST METHOD

CROSS-REFERENCE TO RELATED APPLICATIONS

This application is based upon and claims the benefit of priority from the prior Japanese Patent Application No. 2005-288824 filed in Sep. 30, 2005, the entire contents of which are incorporated herein by reference.

BACKGROUND OF THE INVENTION

Field of the Invention

The present invention relates to an interface test system when different interface operation specifications are used between a semiconductor integrated circuit apparatus having an interface for data transmission/reception and a connection partner device during the test of a high-speed parallel interface.

With an increasing speed and a larger capacity of a recent communication network, for example, a 32-bit width high-speed parallel interface has been used for data transmission/reception. When a test is conducted for a high-speed interface loaded into an LSI device used in the above-mentioned communications, an expensive tester capable of discriminating a result of a high-speed test is required. Unlike a common general-purpose LSI, a special ASIC, etc. which cannot be expected for a mass-shipment is subject to a high evaluation cost when the expensive tester is used, thereby failing in acquiring profitable businesses. In this situation, there is a high demand for an LSI test with a high-speed interface using a less expensive low-speed tester.

The conventional technology of the interface test system is explained below by referring to FIGS. 1 through 8. FIG. 1 shows the conventional technology of the interface connection system between an ASIC 100 and a connection partner device 101. In FIG. 1, an IF unit 102 of the ASIC 100 is connected to an IF unit 103 of the connection partner device 101. It is assumed that the IF unit 103 of the connection partner device 101 and the IF unit 102 of the ASIC 100 have different operation specifications.

FIG. 2 is an explanatory view of the conventional technology of the interface test system for the conventional technology of the connection system shown in FIG. 1. In FIG. 2, the IF unit 103 of a connection partner device is provided as an IF unit exclusively for an interface test in the ASIC 100, test data transmission and reception are performed between two high-speed IF units 102 and 103 using a BIST (built-in self-test) circuit 104 incorporated into the ASIC 100 for a test, and a test result is discriminated by a tester 105, thereby conducting the test at the speed of the practical use state on the two IF units 102 and 103.

FIG. 3 is a more detailed explanatory view of the interface test system shown in FIG. 2. In FIG. 3, the status of a development LSI 111 and a connection partner LSI 112 on a system base 110 connected through a transmission line 115 is simulated on an evaluation board 120, and a high-speed interface test is performed.

That is, in an evaluation target LSI 121 on the evaluation board 120, a high-speed IF unit 123, which is the same as a high-speed IF unit 113, on the development LSI 111 side and an IF transmission/reception unit 124 corresponding to an IF unit 114 as a connection partner for the high-speed IF unit 123 are provided, and the high-speed IF unit 123 and the IF transmission/reception unit 124 are connected via a transmission line 125 on the evaluation board 120.

Under the control of a high-speed IF test control unit 126 on the evaluation target LSI 121, a high-speed transfer test of test data is performed between the high-speed IF unit 123 and the IF transmission/reception unit 124, the test result is discriminated by a discrimination unit 127, and a discrimination result is further transmitted to a low-speed tester 122. The low-speed tester 122 only checks the discrimination result of the discrimination unit 127, and the low-speed tester 122 can finally test the high-speed interface.

However, in the interface test system of the conventional technology explained by referring to FIGS. 2 and 3, it is necessary to provide a connection partner IF unit having different operation specifications exclusively for the test to test the high-speed interface, which includes a number of unnecessary circuits and PAD for a normal operation, thereby causing a large area penalty and a high cost.

FIG. 4 is an explanatory view of a conventional technology in a different connection system between the IF unit 102 of the ASIC 100 and the IF unit 103 of the connection partner device 101. In the conventional technology, it is assumed that two IF units 102 and 103 have the same operation specifications.

FIG. 5 is an explanatory view of the interface test system of the conventional technology for the connection system shown in FIG. 4. In this system, there are plurality of, for example, two IF units 102 having the same operation specifications in the ASIC 100, and an interface test is performed by simply connecting the two IF units.

Generally, in the ASIC 100, there are a plurality of IF units having the same operation specifications for connection to a plurality of devices as connection partners. In FIG. 5, the IF units 102 are interconnected, the transmission/reception of test data is controlled by the BIST circuit 104, and the result id discriminated by the tester 105. Since the operation specifications of the connected IF unit are the same, the existing circuits can be simply connected to perform a test at a practical operation speed. However, when a connection partner device has different operation specifications, the test system cannot be used.

FIG. 6 is an explanatory view of an example of the conventional technology using a different interface test method for the connection system shown in FIG. 4. The conventional technology corresponds to the case in which a single IF unit is loaded into an ASIC. Two ASICs $100_1$ and $100_2$ are loaded into the evaluation board, the IF unit of each ASIC transmits and receives test data, and the result is discriminated by a tester, thereby allowing a test of an interface of the ASIC having only one IF unit to be performed at a practical operation speed.

However, in the test system shown in FIG. 6, it is necessary to load two ASICs on the evaluation board. When there is no space to load two ASICs on the evaluation board, it is difficult to perform the test. When the test result refers to a negative discrimination, it is necessary to determine which ASIC has a fault, thereby complicating the process of performing the test. That is, in FIG. 5, only one ASIC is used. Therefore, when the test result refers to a negative discrimination, the ASIC itself cannot be used. In FIG. 6, it is necessary to determine which ASIC cannot be used, thereby requiring a laborious operation, a prolonged testing time, and also a high testing cost.

FIGS. 7 and 8 are explanatory views of a conventional technology having another interface test system for the connection system shown in FIG. 4. In this conventional technology, as in the case shown in FIG. 6, only one IF unit is provided in the ASIC. The signal output from the transmission unit in one IF unit is looped back as is to the reception unit.

In FIG. 7, a transmission port 106 and a reception port 107 of the IF unit 102 are connected to each other, the test transmission data output from the transmission unit is looped back and received by the reception unit, thereby allowing the test to be performed by the IF unit 102 at a practical operation speed.

In FIG. 8, one IF unit 102 can be tested as in the case shown in FIG. 7 by closing a switch 108 provided as shown in FIG. 7. However, in the above-mentioned conventional technology, the test is performed on only one IF unit, that is, on an IF unit having one transmission unit and one reception unit. For example, when a plurality of data signals are transmitted and received as in a parallel interface, the variance among the data signals cannot be tested.

As the conventional technology of the system of testing an LSI including a high-speed interface, for example, the patent document 1 discloses the test system using a BIST circuit provided in the LSI using a loopback path connecting the external output terminal and the external input terminal of the semiconductor integrated circuit apparatus having a high-speed input/output device through a transmission line. In this conventional technology, as explained above-mentioned by referring to FIGS. 7 and 8, only one IF unit is tested, and it is not applicable to the test of, for example, a parallel interface.

[Patent Document 1] Japanese Patent Publication No. 3446124

SUMMARY OF THE INVENTION

The present invention aims at performing a test on an interface without providing an interface of a connection partner device for a test by operating one of a plurality of IF units provided in one ASIC as a pseudo interface for performing a pseudo operation of an interface of the connection partner device when the connection partner device has different operation specifications of an interface. In the case of parallel interfaces, the test including of checks of variance among data signals in the parallel interface can be performed by connecting a plurality of transmission/reception units in both interfaces to the corresponding transmission/reception unit in each partner interface.

The semiconductor integrated circuit apparatus according to the present invention includes: a plurality of interfaces for transmitting and receiving data; and an emulation control unit for allowing one of the plurality of interfaces to perform an operation of emulating an interface of a connection partner device in data transmission/reception and having different interface operation specifications.

The interface test method according to the present invention is used by a semiconductor integrated circuit apparatus, including a plurality of interfaces for performing data transmission/reception, connects two of the plurality of interface via a transmission line, controls one of the two interfaces to perform an operation of emulating an interface of a connection partner device of the semiconductor integrated circuit apparatus which has different interface operation specifications, allows data to be transmitted and received between an interface for performing the emulating operation and the other of the two interfaces, and obtains a test result of the interface depending on the data transmission/reception result.

BRIEF DESCRIPTION OF THE DRAWINGS

FIG. 11 is an explanatory view of the data writing operation to the DDR-SDRAM;

FIG. 12 is an explanatory view of the data reading operation from the DDR-SDRAM;

FIG. 13 shows an example of the configuration of the interface in the ASIC;

FIG. 15 shows an example of the configuration (first embodiment) of the ASIC interface for emulating a DDR-SDRAM interface.

FIG. 19 is an explanatory view of the determination logic of a control signal for data transmission/reception shown in FIG. 18;

FIG. 22 is an explanatory view of the third embodiment of the interface test system.

DESCRIPTION OF THE PREFERRED EMBODIMENTS

Figure 9:
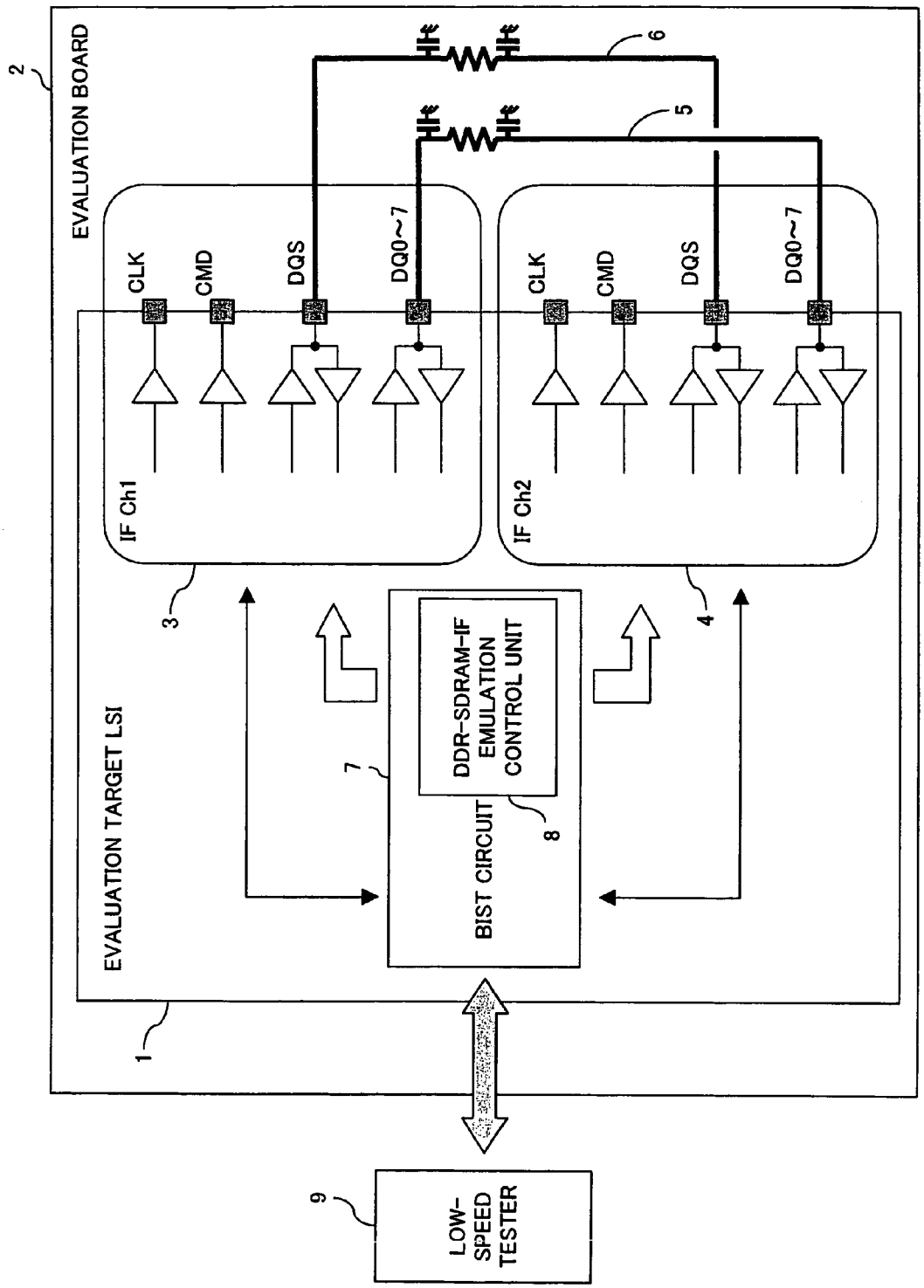
FIG. 9 is an explanatory view showing the principle of the interface test system according to the present invention.

FIG. 9 is an explanatory view showing the principle of the interface test system including the interface test control circuit. FIG. 9 is an explanatory view showing the principle of the interface test system comprising a circuit for controlling the test of an interface, for example, a DDR-SDRAM interface emulation control unit 8. The evaluation target LSI 1 is a semiconductor integrated circuit apparatus (LSI) having a plurality of, for example, two interfaces (channel 1, channel 2) for transmission/reception of data with an external device.

In the interface test system according to the present invention, when the two interfaces 3 and 4 are connected on, for example, an evaluation board 2 via a transmission line 5 of a data signal (DQ 0 through 7) and a transmission line 6 of a data strobe signal (DQS), one of the two interfaces 3 and 4 is allowed by the emulation control unit 8 to perform an operation of emulating an interface of a connection partner device which is an original connection partner device of the evaluation target LSI 1 and has different interface operation specifications.

In the present invention, the emulation control unit, for example, an DDR-SDRAM interface emulation control unit 8 is incorporated into, for example, the evaluation target LSI 1, and is included in a built-in self-test (BIST) circuit 7 for generating test data.

Figure 1:
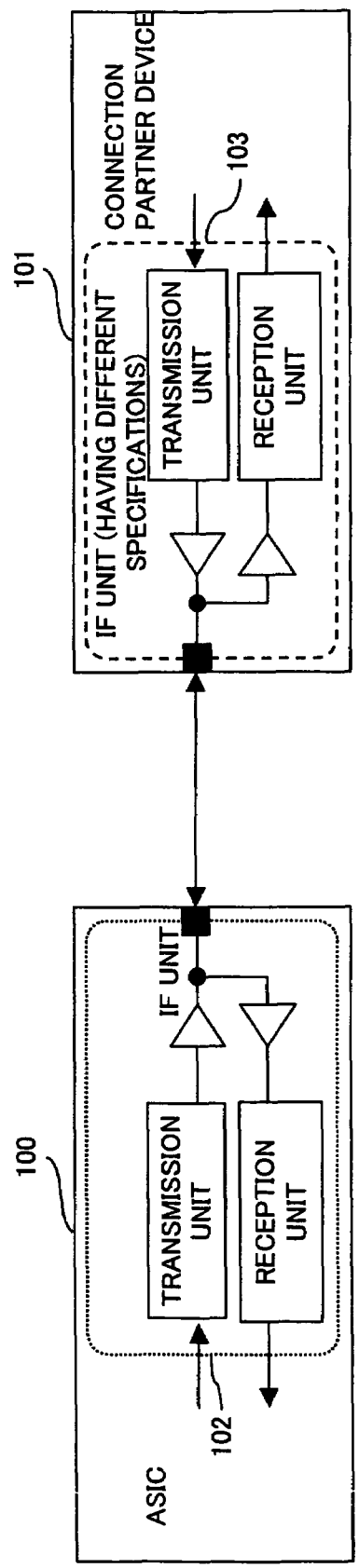
FIG. 1 shows an example of the conventional technology of the interface connection system when the interface operation specifications of the connection partner device are different.
Figure 2:
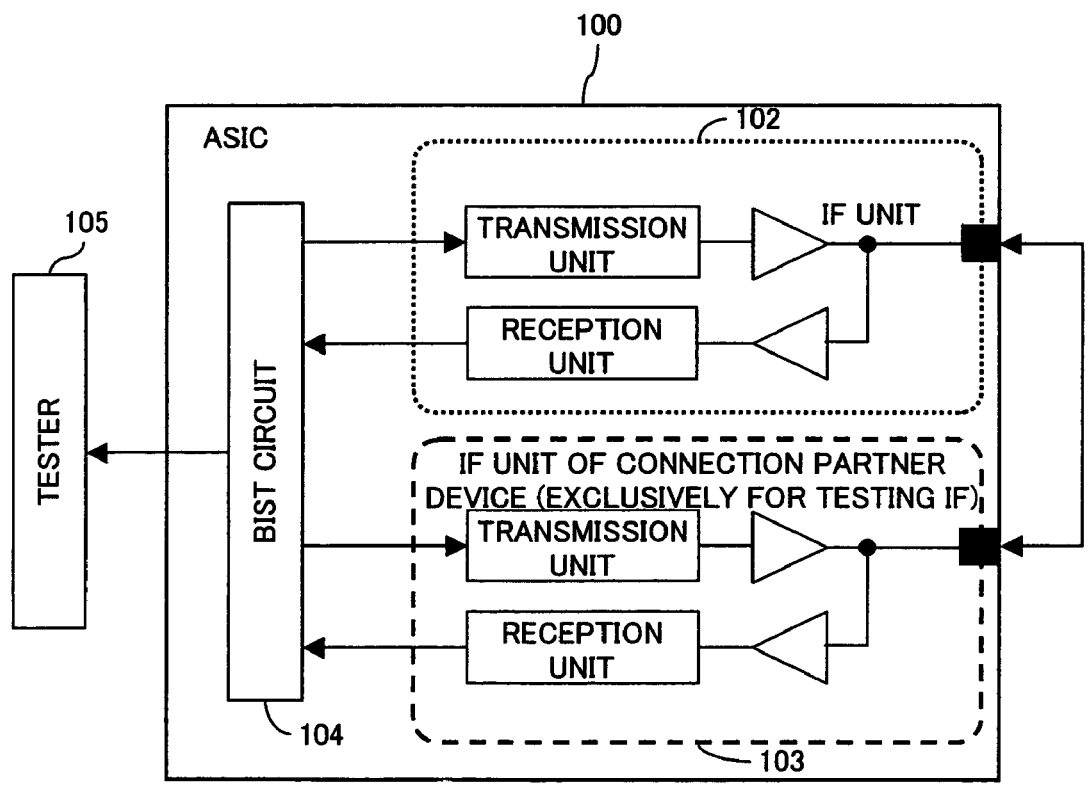
FIG. 2 is an explanatory view of the interface test system according to the conventional technology shown in FIG. 1.
Figure 3:
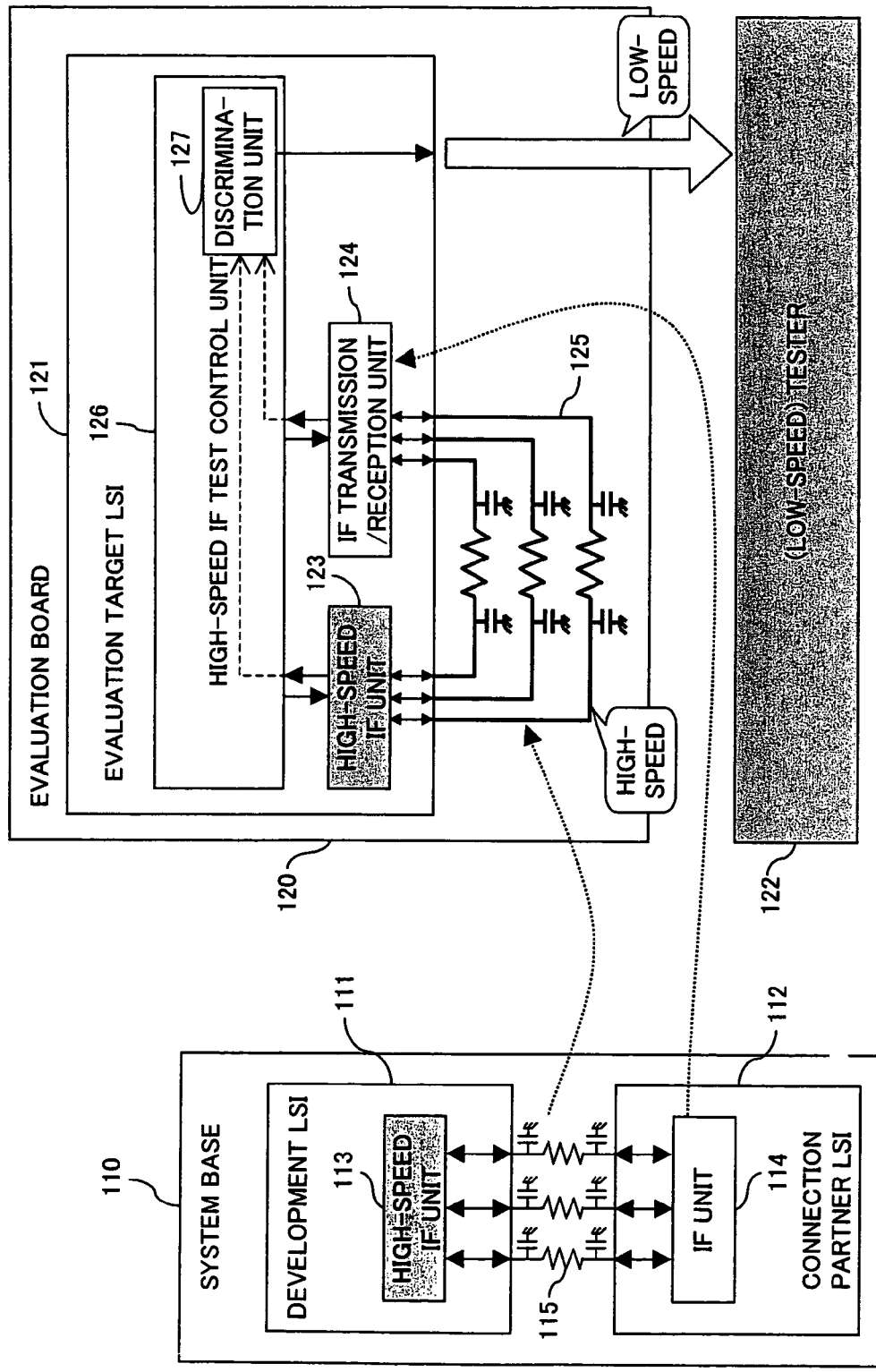
FIG. 3 is a detailed explanatory view of the interface test system according to the conventional technology shown in FIG. 1.
Figure 4:
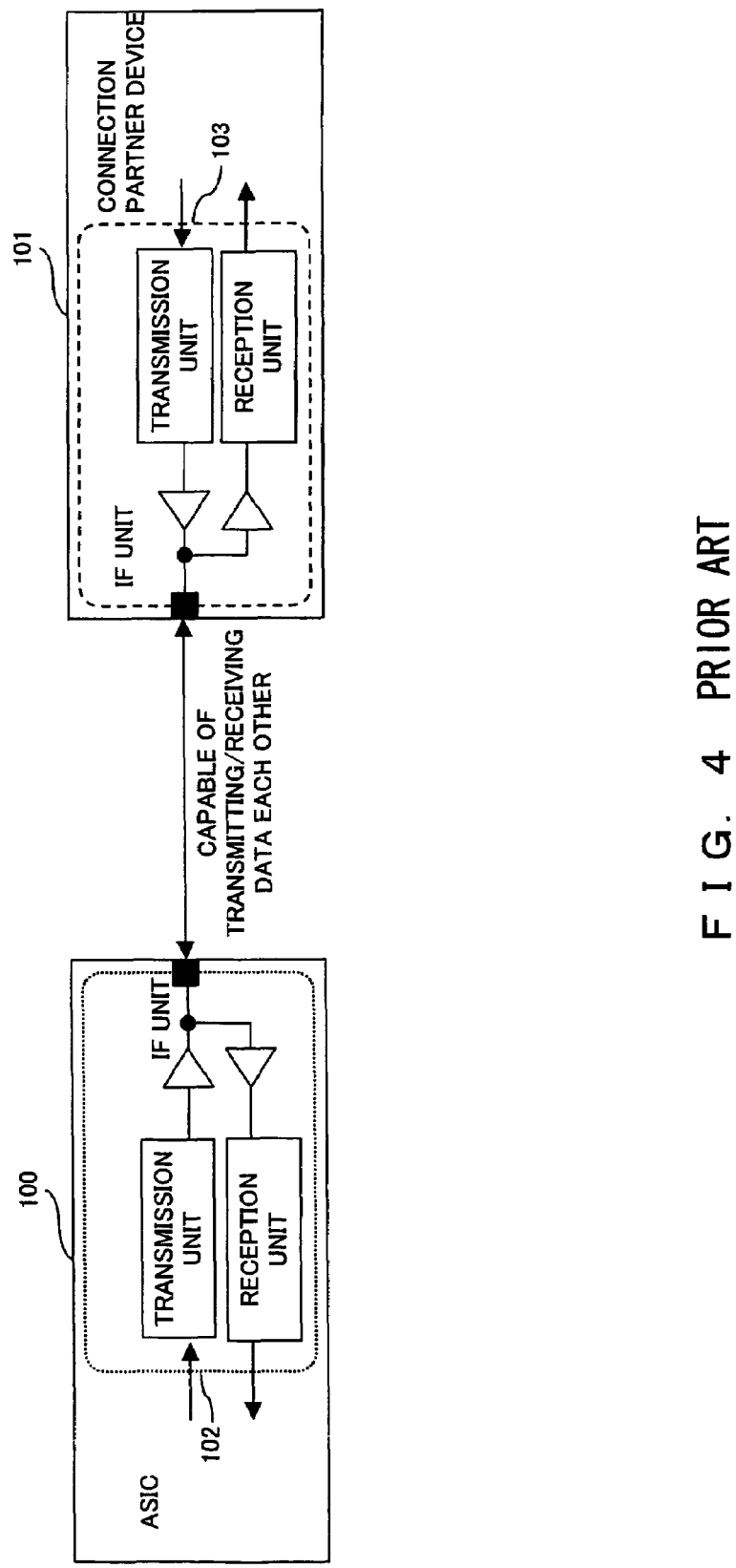
FIG. 4 shows an example of the conventional technology of the interface connection system when the interface operation specification of the connection partner device is the same.
Figure 5:
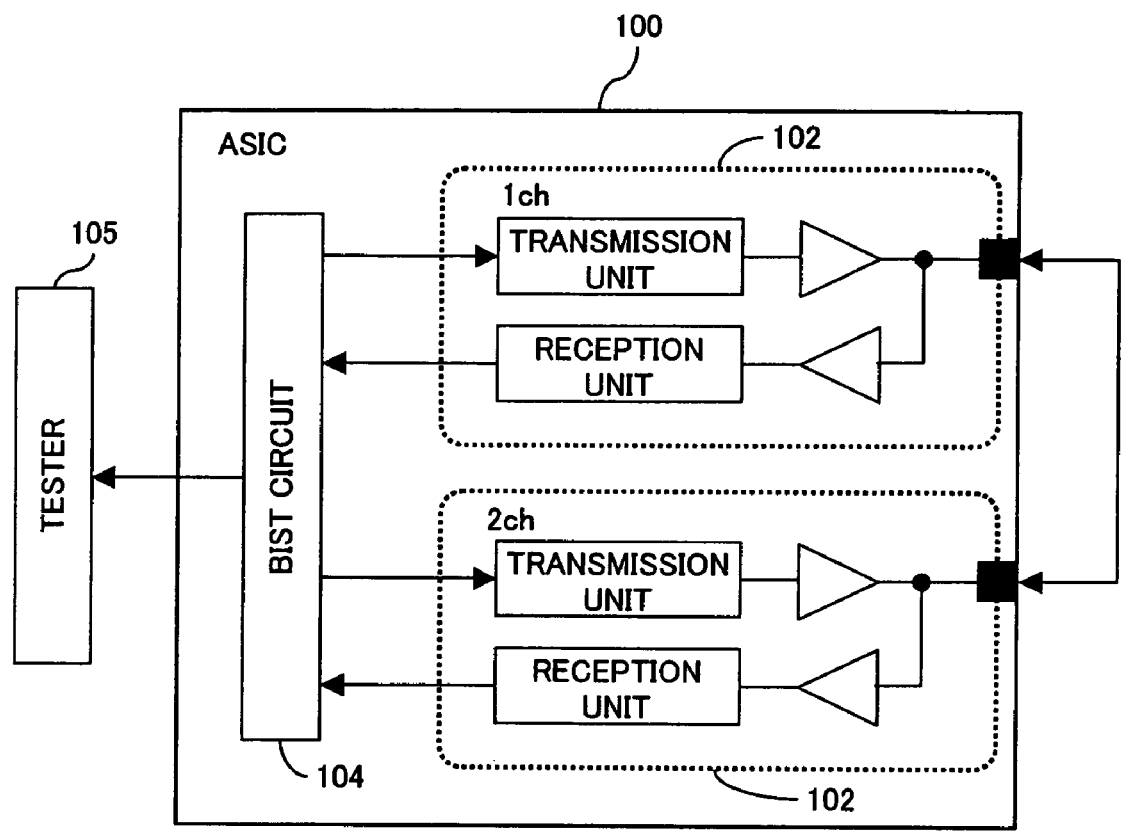
FIG. 5 is an explanatory view of the interface test system (1) according to the conventional technology shown in FIG. 4.

The interface test method according to the present invention is used in an LSI having a plurality of interfaces for data transmission/reception with an external device, and used in, for example, the configuration shown in FIG. 1.

In the interface test method according to the present invention, among a plurality of interfaces, two interfaces 3 and 4 are connected via a transmission line on the evaluation board 2, for example, via the transmission line 5 of a data signal and the transmission line 6 of a data strobe signal, the emulation control unit 8 in an LSI for example, the evaluation target LSI 1 controls one of the two interfaces 3 and 4 to perform an operation of emulating the interface of a connection partner device of the LSI 1 having different interface specifications, the transmission/reception of test data is performed between the interface for performing the emulating operation and the remaining interface of the two, and a test result of the interface is obtained by, for example, a low-speed tester 9 depending on the test data transmission/reception result.

In the interface test method according to the present invention, the evaluation target LSI 1 comprises the built-in self test circuit 7, the test data generated by the built-in self test circuit 7 is transmitted and received between the two interfaces.

The interface test method according to the present invention uses two LSIs having one interface for data transmission/reception, the interfaces of the two LSIs are connected via a transmission line, the emulation control unit in one LSI of the two LSIs controls the interface of the pertinent LSI to perform the operation of emulating the interface having different operation specifications from that of the interface of the pertinent LSI, the transmission/reception of the test data is carried out between the interfaces of the two LSI, and a test result of the interface is obtained depending on the transmission/reception result.

As described above, according to the present invention, in testing of the interface for data transmission/reception with an external device, for example, in testing of a high-speed interface, one of a plurality of interfaces is allowed to perform an operation of emulating the interface of a connection partner device having different interface operation specifications, and performs transmission/reception of test data with the remaining interface, thereby performing a test of the interfaces.

According to the present invention, in an LSI having a plurality of interfaces, one interface performs an operation of emulating an interface of a connection partner device which is an original connection partner device of the LSI and has different interface operation specifications, and connects a transmission line to the other interface, thereby correctly performing a test on the interface when the connection partner device is connected. In the LSI having only one interface, the interface performs a similar emulating operation, a transmission line is connected to the other interface of the LSI, thereby performing a test on the interface.

The present invention relates to the interface test system on, for example, an LSI having an interface of different operation specification from that of the connection partner interface as described above. An embodiment of the present invention in which a connection partners device of a common communication ASIC is SDRAM (synchronous dynamic random access memory) of the double data rate (DDR) capable of doubling the band width of data transfer in comparison with common SDRAM.

Figure 10:
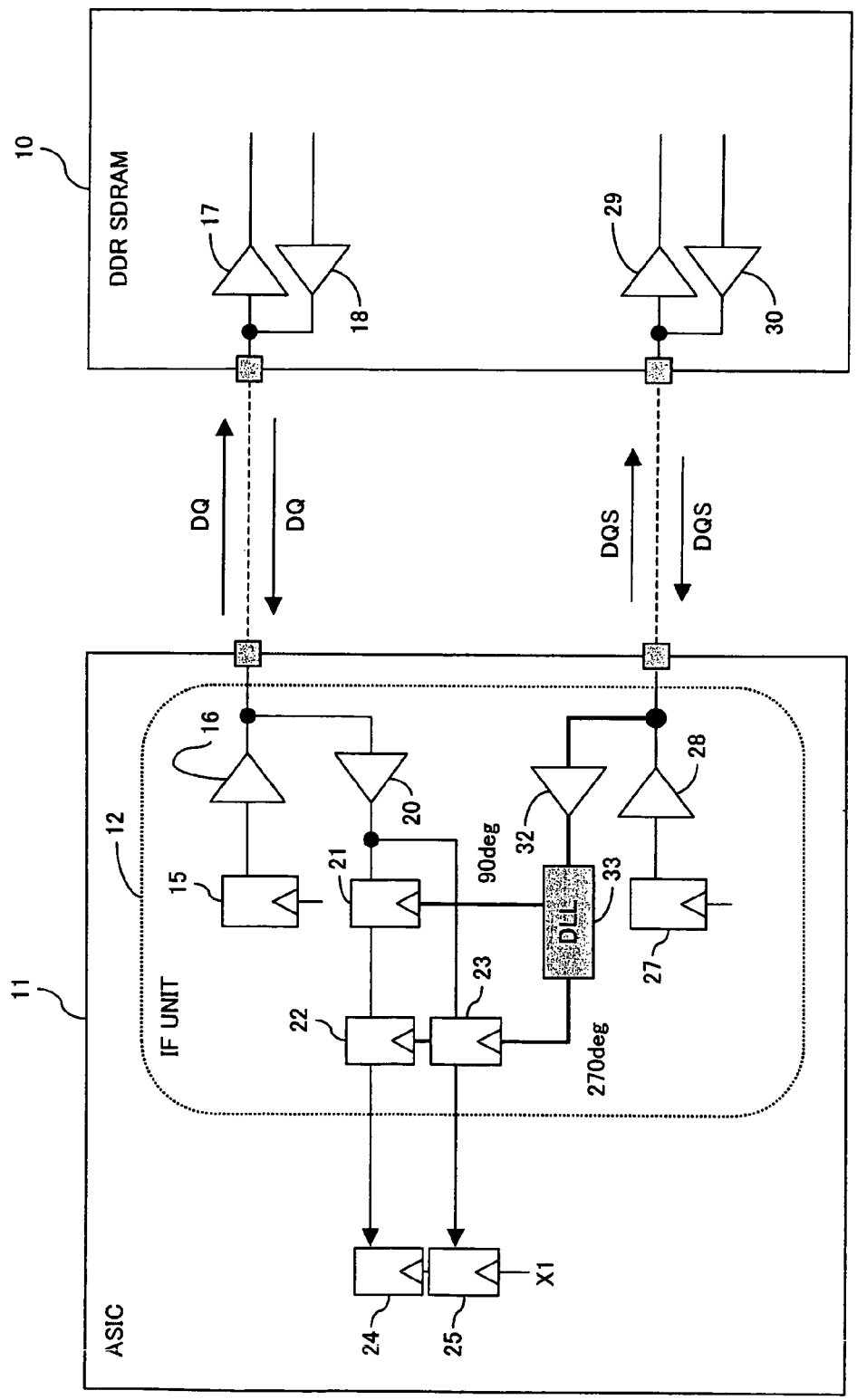
FIG. 10 is an explanatory view of the data transmission/reception between normal ASIC and DDR-SDRAM.

FIG. 10 is an explanatory view of the basic data transmission/reception system between an ASIC 11 as a common LSI and DDR-SDRAM 10. In FIG. 10, when data is transmitted from the ASIC 11 to the DDR-SDRAM 10, that is, when data is written to the DDR-SDRAM 10, a data signal DQ is transmitted from an FF 15 holding data to be transmitted by an IF unit 12 in the ASIC 11 to the DDR-SDRAM 10 through a transmission buffer 16, and the data is received by reception buffer 17.

At this time, the data strobe signal DQS for determination of the timing with which data is to be fetched on the DDR-SDRAM 10 is transmitted through a strobe signal transmission buffer 28 from a flip-flop 27, and the strobe signal DQS is received by a strobe signal reception buffer 29. At this time, for example, the phase of the data strobe signal DQS lags about 90° behind that of the data signal DQ, and the DDR-SDRAM 10 latches data at the rising edge of the data strobe signal DQS.

When data is transmitted from the DDR-SDRAM 10 to the ASIC 11, that is, data is read from the DDR-SDRAM 10, the read data is transmitted by a transmission buffer 18 of the DDR-SDRAM 10, and the data is received by a data reception buffer 20 in the IF unit 12 of the ASIC 11. Since the received data is transmitted at the double speed of the clock signal X1 of the core unit (internal logic unit) of the ASIC 11 (double data rate), the speed is decreased by half, and fetched into two flop-flops 24 and 25 in the internal logic unit through three flip-flops 21 through 23 to enable the data to be processed in the internal logic unit.

At this time, the data strobe signal DQS from the DDR-SDRAM 10 is transmitted by a strobe signal transmission buffer 30 to the ASIC 11, the strobe signal is received by a strobe signal reception buffer 32, and the strobe signal is supplied to a delay locked loop (DLL) 33.

There is no phase difference between the data signal DQ and the data strobe signal DQS transmitted from the DDR-SDRAM 10. Therefore, to process received data by the ASIC 11 with the same phase relationship between the data signal DQ and the data strobe signal DQS transmitted from the ASIC 11, the phase of the data strobe signal DQS transmitted from the DDR-SDRAM 10 is delayed 90° or 270° by the DLL 33, and the delayed signal is provided as a clock signal for fetching data to the flip-flop (FF) 21 or the flip-flops (FFs) 22 and 23, thereby allowing the ASIC 11 to integrally process the phase relationship between the data signal DQ and the data strobe signal DQS for the data writing and reading operations.

FIGS. 11 and FIG. 12 are time charts of the data writing and reading operations for the DDR-SDRAM 10. In the writing operation shown in FIG. 11, a write command is transmitted from the ASIC 11 to the DDR-SDRAM 10, the data signal DQ is transmitted at the double frequency of the clock of the ASIC 11, and the data is latched in the DDR-SDRAM 10 at the rising and falling edges of the data strobe signal DQS whose phase lags 90° behind the data signal DQ.

In the reading operation shown in FIG. 12, a read command is issued from the ASIC 11 to the DDR-SDRAM 10. In response to the read command, the data strobe signal DQS is transmitted from the DDR-SDRAM 10 to the ASIC 11 with no phase shift from the data signal DQ. Then, as described above, the data strobe signal DQS is delayed, for example, by 90° in phase, and used at the latch of the data signal DQ in the ASIC 11.

In the present embodiment, for example, a plurality of IF units are provided in the ASIC 11 as a common LSI. Among the plurality of IF units, between two IF units test data transmission and reception are performed. One IF unit performs an operation of emulating an IF unit in the DDR-SDRAM 10.

FIG. 13 shows the basic configuration of one IF unit in the ASIC 11. Ad described later, an emulation control unit for allowing the IF unit to operate as an interface of the DDR-SDRAM 10 is to be added in the IF unit 12, thereby allowing one IF unit 12 in the ASIC 11 to perform the same operation as the interface of the DDR-SDRAM 10.

The IF unit 12 shown in FIG. 13 is obtained by basically expanding the IF unit explained by referring to FIG. 10 for n+1 parallel data signals DQ0 to DQn. That is, it provides with, corresponding to each data signal DQ0 to DQn, the FF 15o to 15n for holding transmission data, the data transmission buffers 16o to 16n, the data reception buffers 20o to 20n, the FF 21o to 21n, 22o to 22n, and 23o to 23n for adjustment the speed of the data transmitted at a double data rate from the DDR-SDRAM 10 to the speed of the clock signal in an internal logic unit (core unit) 31 of the ASIC 11.

The delay locked loop 33 delays by 90° the phase of the data strobe signal DQS transmitted from the DDR-SDRAM 10 in FIG. 13, the signal output by the DLL 33 is used as a clock signal CKDQSP for fetching data to the FF 21o to 21n. The signal is further inverted by an inverter 34 and the resultant signal is used as a clock signal CKDQSn for fetching data to FF 22o to 22n, 23o to 23n.

To realize the double data rate in the IF unit 12, the clock signal CK_X2 having a double frequency of the clock signal X1 (=X1p) used in the internal logic unit 31 is provided for first state inverter 35a in series inverters 35a and 35b. The output of the inverter 35b is substantially provided for fetching the data strobe signal DQS (for transmission to the DDR-SDRAM 10) to the FF 27, as an X2 forward (in-phase) signal X2p which is the same as the clock signal X2. The output of the inverter 35a is provided as a clock signal for the FF 15o to 15n for holding transmission data, as an X2 inverted signal X2n.

Figure 14:
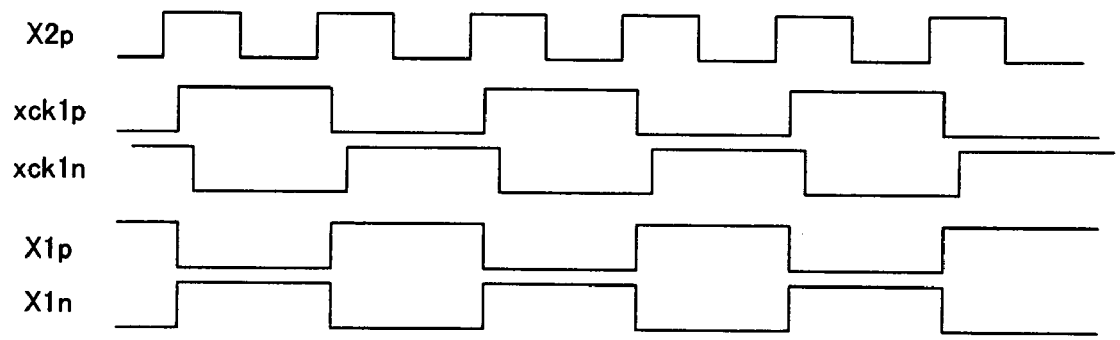
FIG. 14 is a time chart of generating a clock signals $X1p$ and $X1n$.

In FIG. 13, the lower terminal than the DQS signal transmission/reception terminal is a transmission terminal for a command (CMD) and an address (ADD), and lower CLKZ and CLKX are clock signals for command and address signals. Although not directly related to the present embodiment, CLKZ and CLKX are related in generating the clock signals X1p and X1n. Therefore, the generation of the clock signals is explained below by referring to the time chart shown in FIG. 14.

The output of the inverter 35b shown in FIG. 13 is provided for the clock terminal of the FF 37. The xck1p having a half frequency of the frequency of the X2p is output by an inverter 36 and an FF 37. The rising edge of the xck1p lags behind the rising edge of the X2p.

The output of the FF 37 is inverted by an inverter 38 to generate xck1n, but its rising edge lags behind the falling edge of xck1p. The xck1p is input to an FF 39a, and the xck1n is input to an FF 39b, and are fetched to each FF at the rising edge of the X2p (refined), thereby generating a forward signal X1p and an inverted signal X1n having a correct 180° phase difference as the output of the FFs.

FIG. 15 shows the configuration of the first embodiment of the interface test system according to the present invention. In the first embodiment, in a plurality of IF units in the ASIC 11, an IF unit functioning as an interface of the DDR-SDRAM 10 as an original connection partner device, that is, an IF unit functioning as a pseudo interface is defined as a channel 1. That is, an IF unit functioning as an internal IF unit of the normal ASIC 11 is defined as a channel 2 (IF unit 12$_2$) as described below.

In FIG. 15, the data strobe signal (DQS) terminals (ports) of the two IF units 12$_1$ and 12$_2$ are connected via the transmission line 6, and the data signal DQ0 terminal (port) to data signal DQn terminal (port) are connected via the transmission line 5, the test data is transmitted and received between the IF units 12$_1$ and 12$_2$, and a test result of the interface is obtained depending on the transmission/reception result.

In this example, to allow one of the IF units 12$_1$ and 12$_2$ to function as a pseudo interface of the DDR-SDRAM 10, an emulation control unit 40 is added to the internal portion of the ASIC 11. The emulation control unit 40 is provided with two AND gates 45 and 46 and an inverter 47 for outputting emulation mode signals emode1z and emode2z for allowing one of the two IF units 12$_1$ and 12$_2$ to function as a pseudo interface, n+1 selectors 48o to 48n corresponding to each of the data signals DQ0 to DQn in the IF unit 12$_1$, and a selector 49 for selecting the output of the DLL 33 or output of the strobe signal reception buffer 32 for receiving the data strobe signal DQS. It is assumed that the IF unit 12$_2$ also is internally provided with n+1 selectors 48o to 48n and the selector 49 for the function as a pseudo interface. The selector 49 is assumed to be included in the emulation control unit 40, but it is obvious that, as compared with FIG. 13, an externally transmitted data strobe signal DQS or a delayed signal of the data strobe signal DQS passes through the selector 49.

For the two AND gates 45 and 46 and the inverter 47 in the emulation control unit 40, a test pattern generation circuit 41 provides an emulating operation directive signal emz and a channel selection signal chselectz for selecting which is to function as a pseudo interface, the IF unit 12$_1$ or 12$_2$. Depending on which is to be assigned "1", the emode1z signal output by the AND gate 45 or the emode2z signal output by the AND gate 46, it is determined which is to function as a pseudo interface, the IF unit 12$_1$ or 12$_2$. The test pattern generation circuit 41 outputs test data used in the interface test, but the transmission/reception of the test data is described later by referring to a view of a more detailed configuration of a circuit.

In FIG. 15, for example, the test data transmitted by the IF unit 12$_2$ is received by the IF unit 12$_1$, and the data fetched by the FF 22o to 22n, and 23o to 23n is provided for an output pattern compression circuit 43 through FFs 51o to 51n, 52o to 52n forming a received data latch unit 42, compressed to, for example, a format in which the low-speed tester 9 can discriminate a test result, and output to the low-speed tester 9. The clock terminals of the FF 51o to 51n, 52o to 52n forming the received data latch unit 42 receive a clock (forward) signal X1p for use in the internal logic unit 31.

Figure 16:
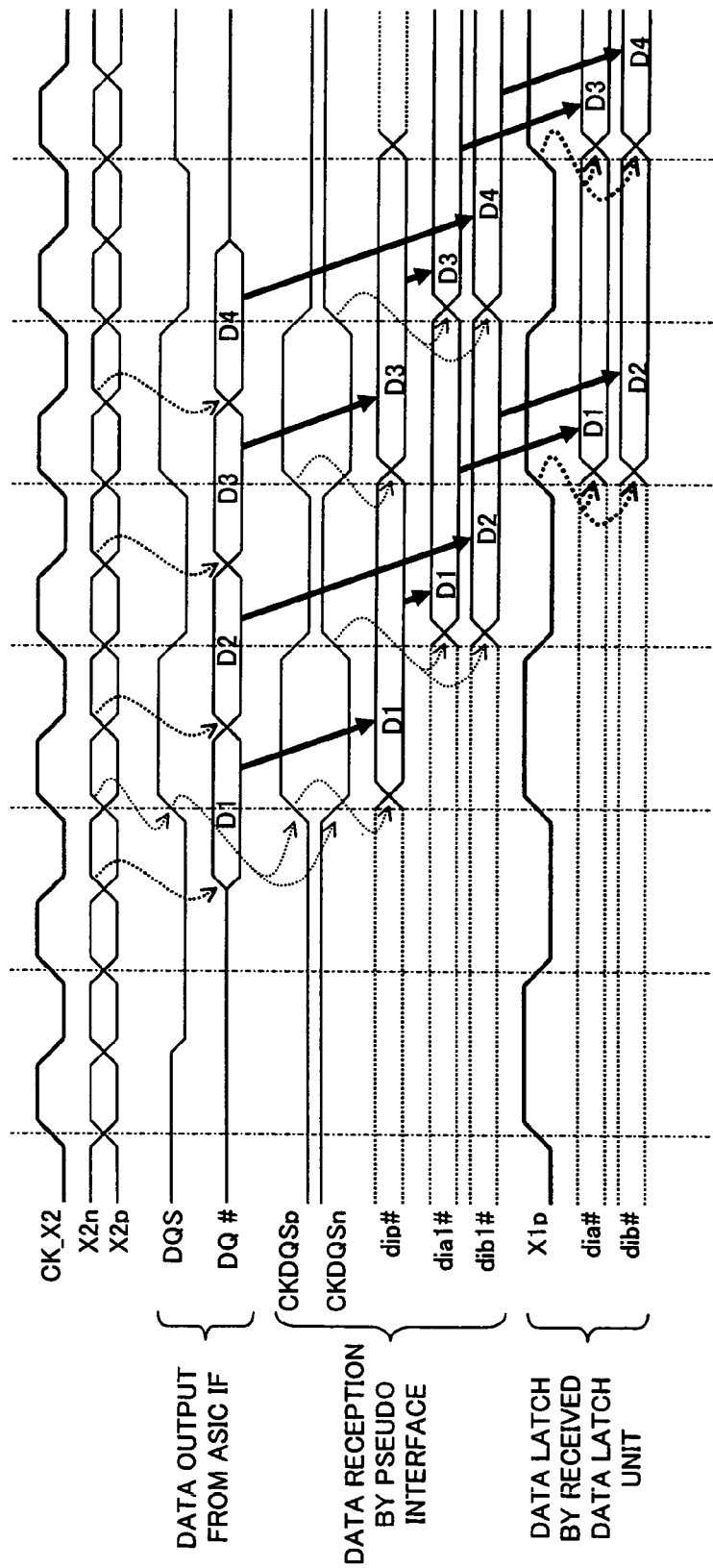
FIG. 16 is a time chart of the interface test when data is written to the DDR-SDRAM.

The operations according to the first embodiment shown in FIG. 15 are explained below by referring to the time charts shown in FIGS. 16 and 17. FIG. 16 is a test time chart in the data writing operation for the DDR-SDRAM. In this case, data is transmitted from the interface of the ASIC to the interface of the DDR-SDRAM. In FIG. 15, the data signals DQ0 to DQn, and the data strobe signal DQS are transmitted from the IF unit 12$_2$ to the IF unit 12$_1$.

During the test, the emz signal output from the test pattern generation circuit 41 is "1", the chselectz signal is "0", As a result, the emode1z signal as output of the AND gate 45 is "1", and the emode2z signal as output of the AND gate 46 is "0", IF unit 12$_1$ functions as a pseudo interface, and the IF unit 12$_2$ functions as an ASIC interface.

The emode1z signal as output of the AND gate 45 is provided for a select terminal S as a selection control signal for the selectors 48o to 48n and the selector 49. All these selectors outputs the input from the input terminal A when the value of the selection control signal is "0", and outputs the input from the input terminal B when it is "1" from the output terminal X. The data strobe signal DQS transmitted from the IF unit $12_2$ as a common ASIC interface to the IF unit $12_1$ as a pseudo interface is used as a clock signal CKDQSp for the FF 21o to 21n for fetching the received data as is through the strobe signal reception buffer 32 and without passing the DLL 33 because the value of the emode1z signal is "1". Its inverted signal CKDQSn by the inverter 34 is used as a clock signal for fetching the data to the FF 22o to 22n, and 23o to 23n.

In FIG. 16, the top waveform is a clock signal CK_X2 for a DDR operation, X2p is an X2 forward signal having the same frequency and phase as CK_X2, X2n is an inverted signal of the X2p. In FIG. 15, a data signal DQ and a data strobe signal DQS are output from the ASIC interface, that is, the IF unit 122 to the IF unit $12_1$ as a pseudo interface.

There are n+1 data signals DQO to DQn. Since these signals are transmitted in parallel, the data in one of the signals is represented by DQ#. That is, the symbol # is one of "0" through "n". If the value of # is "0" for simplicity, four pieces of data from D1 to D4 are serially output as data signal DQ0 from the IF unit $12_2$, and the data strobe signal DQS is synchronous with the rising edge of the forward clock X2p, and transmitted to the IF unit $12_1$ with the phase lags behind the data signal DQ0 by 90°.

The process is performed as described above because X2p is provided as a clock signal for the FF 27 at the previous stage of the strobe signal transmission buffer 28 in FIG. 13. In addition, since the inverted clock signal X2n is provided as a clock signal for the FF 15o at the previous stage of the transmission buffer 16o for the data signal DQ0, the data D1, D2, . . . are output at the rising edge of X2n.

In the IF unit $12_1$ functioning as a pseudo interface, the data strobe signal DQS received as described above is used as is as a signal CKDQSp, and its inverted signal is used as CKDQSn, thereby fetching received data to the FF. First, the first data D1 is fetched to the FF 21o at the rising edge of the CKDQSp signal, then the data D1 is shifted from the FF 21o to 22o at the rising edge of the CKDQSn signal, the next data D2 is fetched to the FF 23o, similarly the data D3 is fetched to the FF 21o at the rising edge of the CKDQSp, shifted to the FF 22o at the rising edge of the next CKDQSn, and simultaneously the data D4 is fetched to the FF 23o.

In the received data latch unit 42, the data of the FF 22o and 23o is sequentially provided for the output pattern compression circuit 43 through the FF 51o and 52o at the rising edge of the clock signal X1p. The data is compressed by the output pattern compression circuit 43, and supplied to the low-speed tester 9.

Figure 17:
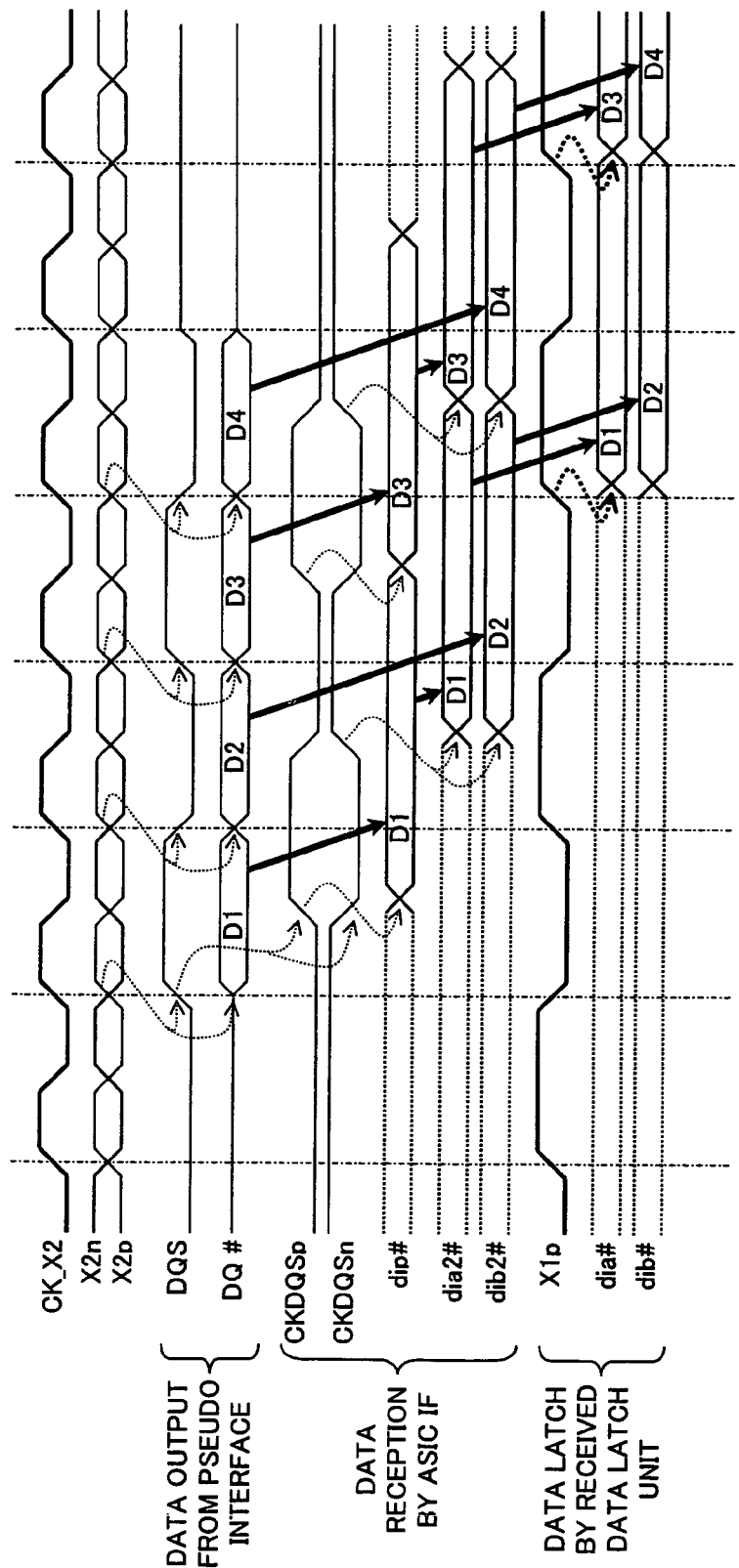
FIG. 17 is a time chart of the interface test when data is read from the DDR-SDRAM.

FIG. 17 is a time chart of the interface test in the data reading operation for the DDR-SDRAM. In this case, the data signal DQ and the data strobe signal DQS are output to the IF unit $12_2$ as an ASIC interface from the IF unit $12_1$ as a pseudo interface. There is no phase shift between the data signal DQ# output from the pseudo interface, for example, DQ0, and the data strobe signal DQS, the first data D1 is output at the rising edge of the DQS, and the next data D2 is output at the falling edge of the DQS. Subsequently, the data D3 and D4 are similarly output in series.

At the IF unit $12_2$ as an ASIC interface, the phase of the data strobe signal DQS is 90° delayed by the delay locked loop 33 through the strobe signal reception buffer 32, and the delayed signal (a clock signal CKDQSP), and the inverted signal of the delayed signal by the inverter 34 (CKDQSn) are used to fetch a data to the flip-flop. That is, the first data D1 is fetched at the rising edge of the CKDQSp signal to the FF21o, and then the data D1 is shifted to the FF 22o at the rising edge of the CKDQSn signal. Simultaneously, the data D2 is fetched to the FF 23o. Similarly, the subsequent operations continue.

The data fetched to the FF 22o and 23o is provided for the low-speed tester 9 by way of the output pattern compression circuit 43 as described above. Although not shown in FIG. 15, the test data transmitted from the pseudo interface ($12_1$) and received by the IF unit $12_2$ as an ASIC interface is compressed by the output pattern compression circuit 43 through the received data latch unit 42 and output to the low-speed tester 9.

FIG. 15 shows only a necessary configuration for basic explanation of an emulating operation, and the operation of the first embodiment is explained above. However, a more practical configuration is required for input and output of data from the internal logic unit 31 in a normal operation, and externally output the test data from the test pattern generation circuit 41 during the testing operation different from the normal operation. The detailed configuration is explained below by referring to FIG. 18 through FIG. 20.

Figure 18:
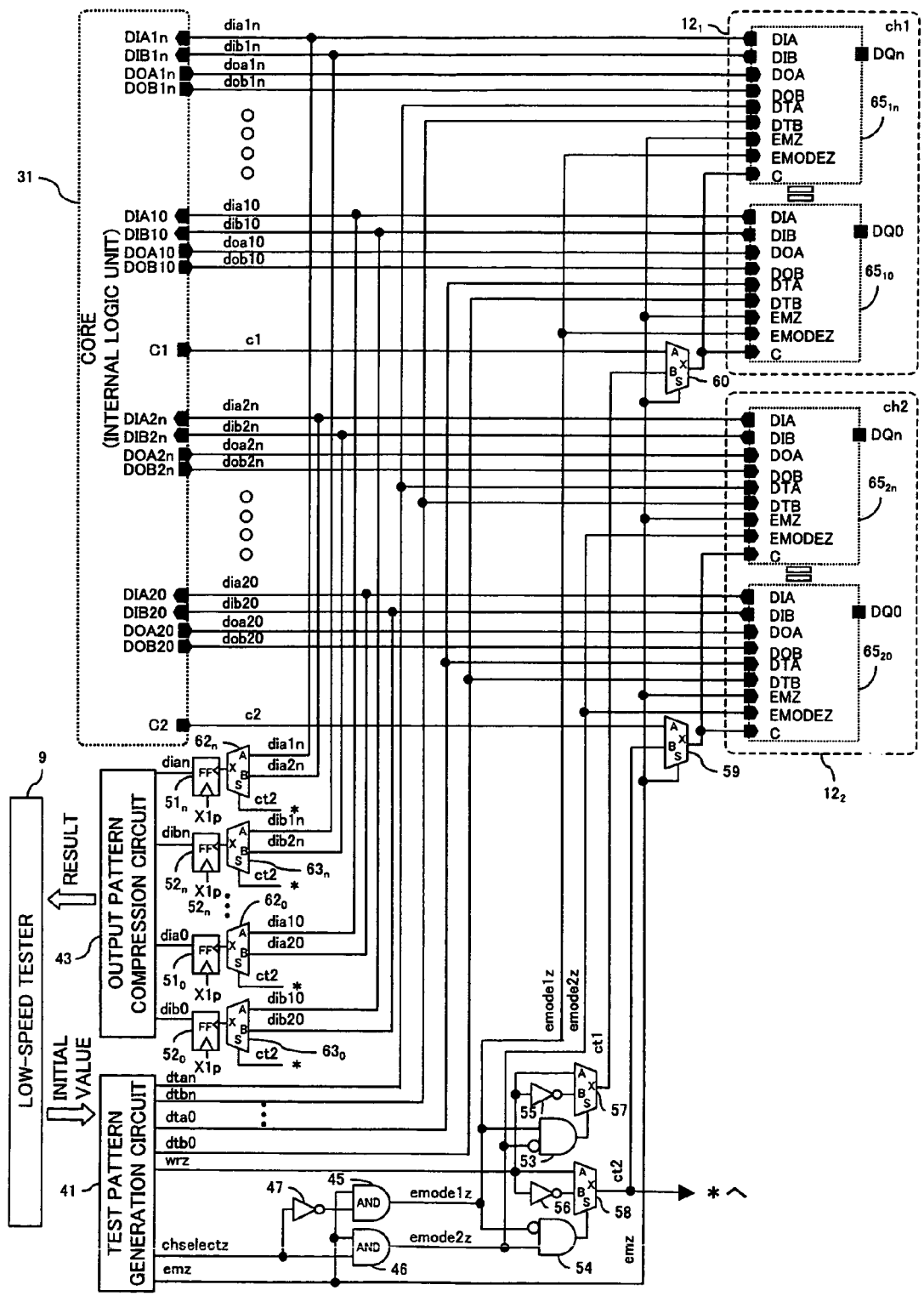
FIG. 18 shows the detailed configuration of an interface including the transmission/reception path of normal and test data.

FIG. 18 shows the detailed circuit configuration for the normal data transmission/reception by the internal logic unit 31, and the transmission/reception of the test data output from the test pattern generation circuit 41 during the test of an interface. In FIG. 18, the portion of the AND gates 45 and 46, the inverter 47, the FF 51o to 51n, and 52o to 52n are the same as those shown in FIG. 15.

Two AND gates 53 and 54, inverters 55 and 56, selectors 57 and 58 to which emode1z and emode2z signals output by the AND gates 45 and 46, and a wrz signal indicating that it shows a write mode of the DDR-SDRAM when the value is "0", and it shows a read mode when the value is "1" are input, output ct1 and ct2 signals as data output enable signals to data transmission/reception unit $65_{10}$ to $65_{1n}$, and $65_{20}$ to $65_{2n}$ corresponding to each data signal DQ0 to DQn in two interfaces $12_1$ and $12_2$.

As described later, for example, in the data transmission/reception unit $65_{10}$, the output enable terminal is provided for the transmission buffer for outputting the data signal DQ0, the 16o as shown in FIG. 15, and when the data output enable signal supplied to the terminal is "0", the data held in the FF 15o is externally output through the transmission buffer 16o.

Selectors 59 and 60 select, as a data output enable signal, one of the output enable signals c1 and c2 from the internal logic unit (core unit) 31, and the enable signals ct1 and ct2 output by the selectors 57 and 58, and output the selected signal to the terminal C of each of the data transmission/reception unit $65_{10}$ to $65_{1n}$, $65_{20}$ to $65_{2n}$. For example, the selector 60 outputs a ct1 signal from the input terminal B to a terminal C when the emz signal indicates "1" during the test of an interface. In the normal operation of the emz signal of "0", the enable signal c1 from the internal logic unit 31, which is input to the input terminal A, is output to the terminal C.

FIG. 19 is an explanatory view showing the logic of determining the data output enable signals ct1 and ct2 during the test of an interface. The logic is realized by the two AND gates 53 and 54, the two inverters 55 and 56, and the two selectors 57 and 58. First, when the emz signal is "0", that is, in the normal operation, the values of the emode1z, emode2z, and wrz signals are don't care (x), and the data output enable signals c1 and c2 from the internal logic units 31 replace the signals ct1 and ct2.

When the emz signal is "1", one of the emode1z signal and the emode2z signal is "1" corresponding to the value of the chselectz signal as described above, and the other is "0". When the emode1z signal is "1" and the emode2z signal is "0", the IF unit $12_1$ (channel 1) functions as a pseudo interface as described above. In this case, the values of the ct1 signal and the ct2 signal are determined by the value of the wrz signal. When the wrz signal is "0", that is, in the write mode of data to the DDR-SDRAM, because the output of the AND gate 53 is "1", the output of the inverter 55 is selected in the input to the selector 57, and the ct1 signal output by the selector 57 is "1". On the other hand, since the output of the AND gate 54 is "0", the input signal to the terminal A among the input to the selector 58 is the output of the selector 58, and the value of the ct2 signal is "0".

The ct1 signal as output of the selector 57 is connected to the input terminal B of the selector 60. At this time, the emz signal as a selection control signal is "1", the selector 60 selects input to the input terminal B, and "1" is output to the terminal C of all data transmission/reception units $65_{10}$ to $65_1$n in the IF unit $12_1$. The signal to the terminal C is provided as an output enable signal for the data transmission buffer with an output enable terminal corresponding to the transmission buffers 16o to 16n shown in FIG. 15 as described later. Since the output enable terminal operates in a negative logic, all data transmission/reception units $65_{10}$ to $65_{1n}$, in the IF unit $12_1$ do not enter a transmission state, thereby operating in the reception state.

On the other hand, the selector 59 similarly selects the input signal ct2 to the input terminal B, and the ct2 provides "0" as the value of the signal for the terminal C of all data transmission/reception units $65_{20}$ to $65_{2n}$ in the IF unit $12_2$. Therefore, the data transmission buffer with an output enable terminal is enabled for output, and all data transmission/reception units $65_{20}$ to $65_{2n}$ can transmit data. Thus, data is transmitted from the IF unit $12_2$ as an interface of the ASIC 11 to the IF unit $12_1$ as a pseudo interface of the DDR-SDRAM, and the data is written.

The data transmitted from the IF unit $12_2$ to the IF unit $12_1$ is normal data output from the internal logic unit 31 in the normal operation, and is test data output by the test pattern generation circuit 41 during the test of an interface. The output data from the internal logic unit 31, that is, the data doa 20 to doa 2n, and dob 20 to dob 2n are output to the DOA terminal and the DOB terminal in the data transmission/reception units $65_{20}$ to $65_{2n}$. The test data is provided by the test pattern generation circuit 41 as the data dta0 to dtan, and dtb0 to dtbn for the DTA and DTB terminals of the data transmission/reception unit $65_{20}$ to $65_{2n}$. In each transmission/reception unit, it is described later which is to be selected, test data or normal data from the internal logic unit 31.

The data transmitted from the IF unit $12_2$ as a normal ASIC interface to the IF unit $12_1$ as a pseudo interface is provided as input signals for the data transmission/reception unit $65_{10}$ to $65_{1n}$, and the signals are output from the terminals DIA and DIB in each transmission/reception unit. The data is transmitted as the dia10 to dia1n, and dib10 to the dib1n to the internal logic unit 31. When the data is test data, the data is sent to the selectors 62o to 62n, and the 63o to 63n. The above-mentioned signal ct2 is provided as a selection control signal for these selectors. In this example, the value of the signal ct2 is "0", input to the input terminal A of each selector is selected, the output of each selector, that is, the dia10 to dia1n, and the dib10 to dib1n are, synchronously with the rising edge of the clock signal X1p, fetched to the flip-flop 51o to 51n, and 52o to 52n, thereby compressed by the output pattern compression circuit 43 and the result is transmitted to the low-speed tester 9.

Back to FIG. 19, when the emode1z signal is "1", the emode2z signal is "0", and the wrz signal is "1", the IF unit $12_1$ (channel 1) functions as a pseudo interface and the IF unit $12_2$ (channel 2) functions normally as an ASIC interface. However, since the wrz signal is "1", and the data read mode from the DDR-SDRAM is used, data is output from the IF unit $12_1$, and the data is received by the IF unit $12_2$.

At this time, the output data doa10 to doa1n and dob10 to dob1n from the internal logic unit 31 or the test data dta0 to dtan, and dtb0 to dtbn output from the test pattern generation circuit 41 are selected and transmitted from the IF unit $12_1$ to the IF unit $12_2$.

At the IF unit $12_2$, the input data dia20 to dia2n, dib20 to dib2n are transmitted to the internal logic unit 31, and provided for the input terminals B of selectors 62o to 62n and 63o to 63n. At this time, the value of the ct2 signal as a selection control signal to each selector is "1", and the data provided for the input terminal B is transmitted as a test result to the low-speed tester 9 through the FFs 51o to 51n, and 52o to 52n, and the output pattern compression circuit 43.

In FIG. 19, when the emode1z signal is "0" and the emode2z signal is "1", the IF unit $12_2$ functions as a pseudo interface, and the IF unit $12_1$ functions as a normal ASIC interface. When the wrz signal is "0", data is transmitted in a write mode from the IF unit $12_1$ to the IF unit $12_2$. When the wrz signal is "1", data is transmitted in a read mode from the IF unit $12_2$ to the IF unit $12_1$. Since the detailed explanation is similar to the explanation given above, it is omitted here.

Figure 20:
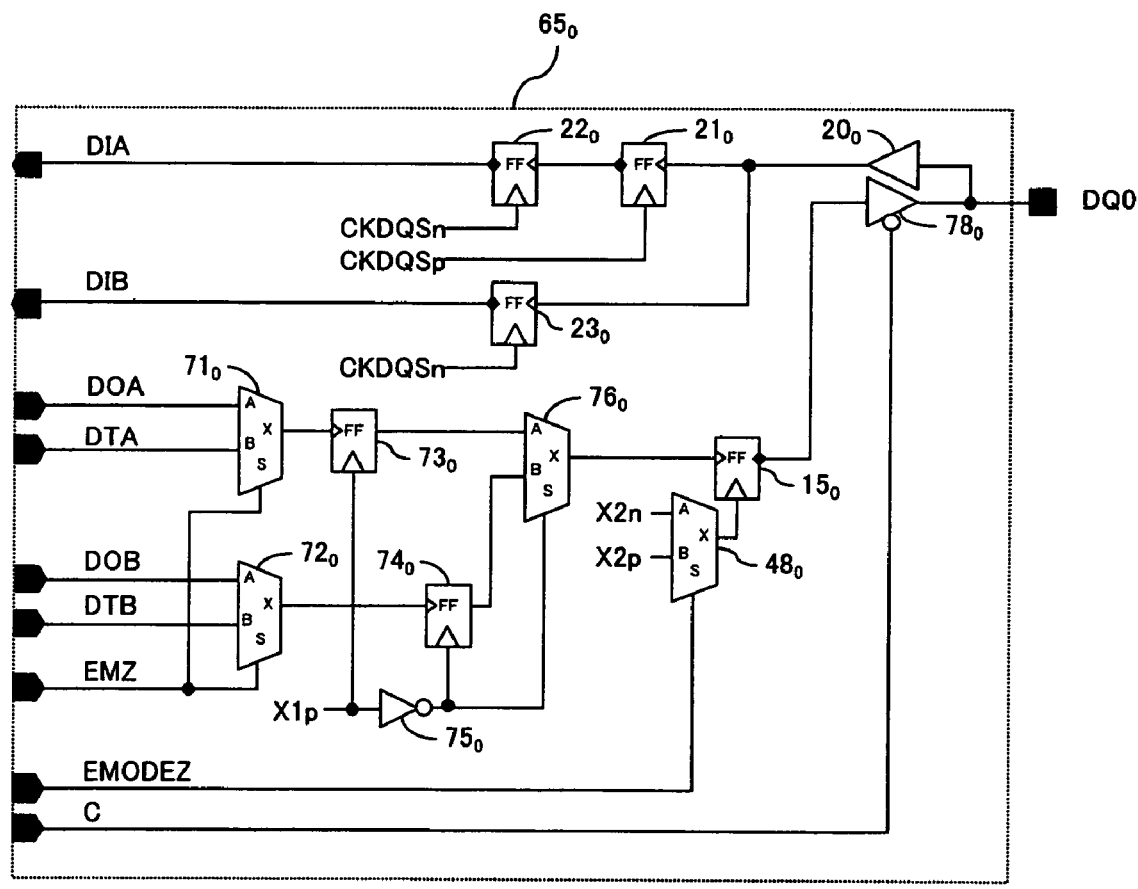
FIG. 20 shows the detailed configuration of the data transmission/reception unit in an interface.

FIG. 20 shows the detailed configuration of the data transmission/reception units $65_{10}$ to $65_{1n}$, and $65_{20}$ to $65_{2n}$ in the IF unit $12_1$ and IF unit $12_2$ shown in FIG. 18. In this example, the configuration of the data transmission/reception unit $65_{10}$ or $65_{20}$ for the data signal DQ0 is shown, but other configuration of the transmission/reception unit can be identical.

When the detailed configuration shown in FIG. 20 is compared with FIG. 15, the data transmission buffer 16o is changed to a data output buffer 78o with an output enable terminal, two selectors 71o and 72o for selection of the output data from the internal logic unit 31 or the test data from the test pattern generation circuit 41 are added. Furthermore, FFs 73o and 74o, an inverter 75o, and a selector 76o for transmission of data at a double speed between the FF 150o at the preceding stage of the transmission buffer 16o in FIG. 15, and the two selectors 71o and 72o are added.

The two selectors 71o and 72o select either the normal data DOA and DOB from the internal logic unit 31 or the test data DTA and DTB from the test pattern generation circuit 41, and provide the selection result for the FFs 73o and 74o. An input signal, the emz signal in FIG. 18, to the EMZ terminal as a selection control signal is provided for the selectors. When the data transmission/reception unit 65o ($65_{10}$ or $65_{20}$) functions on the pseudo interface during the interface test, the data to be transmitted to the partner is test data. Therefore, when the value of the emz signal is "1", the signals from the terminals DTA and DTB are output as test data from two selectors 71o and 72o. On normal ASIC interfaces, two selectors 71o and 72o select and output the signals from the internal logic unit 31 as transmission data, that is, the input signals to the terminals DOA and DOB.

The FF 73o fetches the input data from the selector 71o at the rising edge of the clock signal X1p, and the FF 74o fetches the input data from the selector 72o at the rising edge of the X1n as an inversion result of the clock signal X1p by the inverter 75o. The selector 76o selects the output of the FF 73o when the selection control signal X1n as the output of the inverter 75o is "0", and selects the output of the FF 74o when it is "1", and provides that for the FF 15o. Thus, the speed of the signal as the output of the selector 76o is double the speed of the output signal of the selectors 71o and 72o. The fetch of the data to the FF 15o is performed at the rising edge of the clock X2p as an input signal to the input terminal B of the selector 48o, when the value of the selection control signal output from the EMODEZ terminal, that is, the emode1z or the emode2z signal is "1".

The data transmission unit according to claim 3 of the scope of the claims of the present invention corresponds to the FFs 15, 73, 74, the selectors 71, 72, 76, the inverter 75, and the data output buffer 78 with an output enable terminal, and the transmission data selection directive signal corresponds to the emz signal output from the EMZ terminal. The data transmission control unit according to claim 4 corresponds to the AND gates 53, 54, the inverters 55, 56, and the selectors 57 and 58 in FIG. 18, and the emulating operation directive signal corresponds to the emode1z signal and the emode2z signal.

The data reception unit according to claim 5 corresponds to the buffer 20, and the FF 21, 22, and 23, and the data reception control unit corresponds to the strobe signal reception buffer 32, the DLL 33, the inverter 34, and the selector 49 shown in FIG. 15, the delay operation directive signal corresponds to the emode1z (or emode2z) signal. Furthermore, the selector according to claim 6 corresponds to the selectors 62 and 63 shown in FIG. 18, and the selection control signal corresponds to the ct2 signal.

As described above, according to the first embodiment of the present invention, by allowing one of a plurality of interfaces to perform the operation of the interface of a connection partner device, a test can be performed by one ASIC. In addition by compressing a test result, a result can be discriminated by a low-speed tester.

Described above in detail is the first embodiment of the interface test system according to the present invention. The second embodiment is explained below by referring to FIG. 21. In the first embodiment, one of the two IF units functions as a pseudo interface of an interface of a connection partner device, for example, the DDR-SDRAM, but the difference in input load between a normal ASIC interface and a DDR-SDRAM interface has not been considered.

Figure 21:
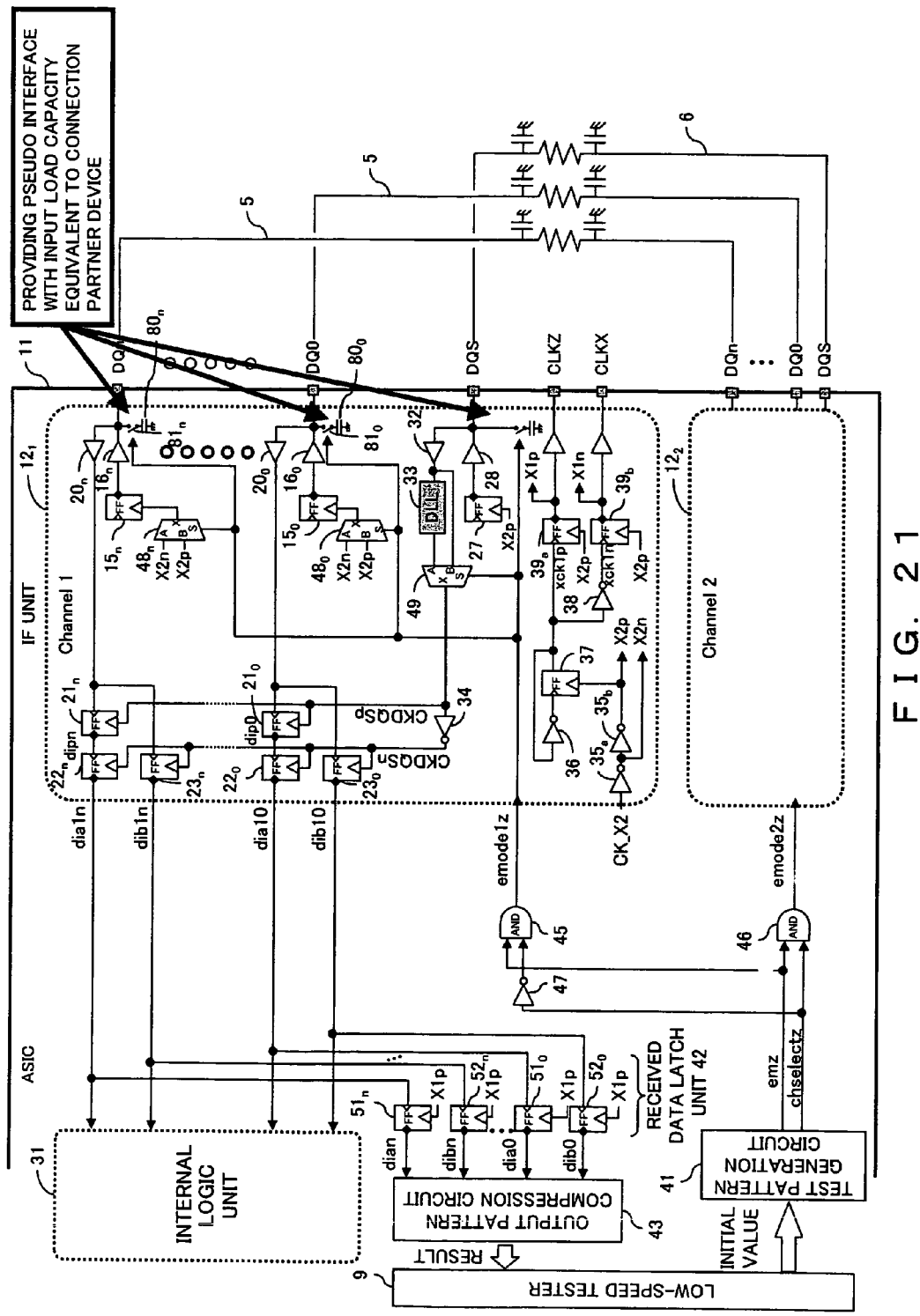
FIG. 21 is an explanatory view of the second embodiment of the interface test system.

In the second embodiment shown in FIG. 21, electro-static capacities 80o to 80n which are equivalent to the input capacity of the interface of a connection partner device, and switches 81o to 81n for connection of each data signal input port and the electro-static capacities are provided, for all the input and output terminals of IF unit which may function as a pseudo interface. When the value of a signal directing the operation as a pseudo interface, for example, the emode1z signal, is "1", all switches 81o to 81n in the corresponding IF unit $12_1$ (channel 1) are closed, and the interface as a pseudo interface has the same input load capacity as the interface of the connection partner device. The emulation control unit 40 shown in FIG. 15 includes the switches 81o to 81n. The other operation as the interfaces is the same as in the first embodiment, and the explanation is omitted here. Thus, in the second embodiment, an interface test with the input load of the connection partner device taken into account can be performed.

FIG. 22 shows the third embodiment of the interface test system according to the present invention. Generally, in the interface of DDR-SDRAM, a data strobe signal DQS is used every eight bits of the data signal DQ. For example, an interface corresponding to 32-bit data can divide a group of data signals into DQ groups 85o to $85_3$, that is, four groups using the each data strobe signal DQS.

In the third embodiment, data is transferred among the groups, for example, the DQ group 85o is connected to the DQ group $85_1$ via the transmission line 6 of the data strobe signal and the transmission line 5 of the data signal, one of the DQ groups is made to function as a pseudo interface and the other is made to function as a normal ASIC interface. Thus, although an IF unit has only one channel, a test can be conducted with the variance between data pieces taken into account in a DQ group unit. The third embodiment can be applied to a device other than DDR-SDRAM so far as a data strobe signal is used in plural bit units.

In the explanation above, the embodiment has been explained using an interface of DDR-SDRAM as an interface having different operation specifications from those of a normal ASIC interface. However, it is obvious that the scope of the present invention is not limited to the relationship with the DDR-SDRAM interface.

The interface which can be applied to the present invention can be expressed by, for example, a high-speed parallel architecture interface having a "source synchronous" characteristic. The source synchronous refers to a transfer of data in synchronization with the signal from a destination. The interface can be, for example, the interface of the DDR2-SDRAM for collectively transferring a plurality of pieces of data, for example, two pieces of data instead of the D1, and a total of four pieces of data instead of the two pieces of data D1 and D2 in FIGS. 16 and 17, and the interface of the XDR-SDRAM for collectively transferring a total of eight pieces of data.

Finally, in the explanation above, for example, a plurality of IF units are provided in the ASIC, one of the IF units emulates the operation of the IF of, for example, DDR-SDRAM, and test data is transmitted and received between the one IF unit and the other IF unit. However, the basic concept of the present invention can be applied also to an ASIC comprising only one IF unit.

That is, the IF units of two ASICs each having one IF unit are connected via a transmission line, one IF unit emulates the operation of an IF unit of DDR-SDRAM, and the other IF unit performs an operation of an IF unit of a normal ASIC, thereby successfully conducting an interface test. This corresponds to the case where, for example, the IF unit $12_2$ shown in FIGS. 15 and 21 is in the other ASIC. Test data can be transmitted and received by connecting the test pattern generation circuit 41, the output pattern compression circuit 43, etc. to the other ASIC.

Figure 6:
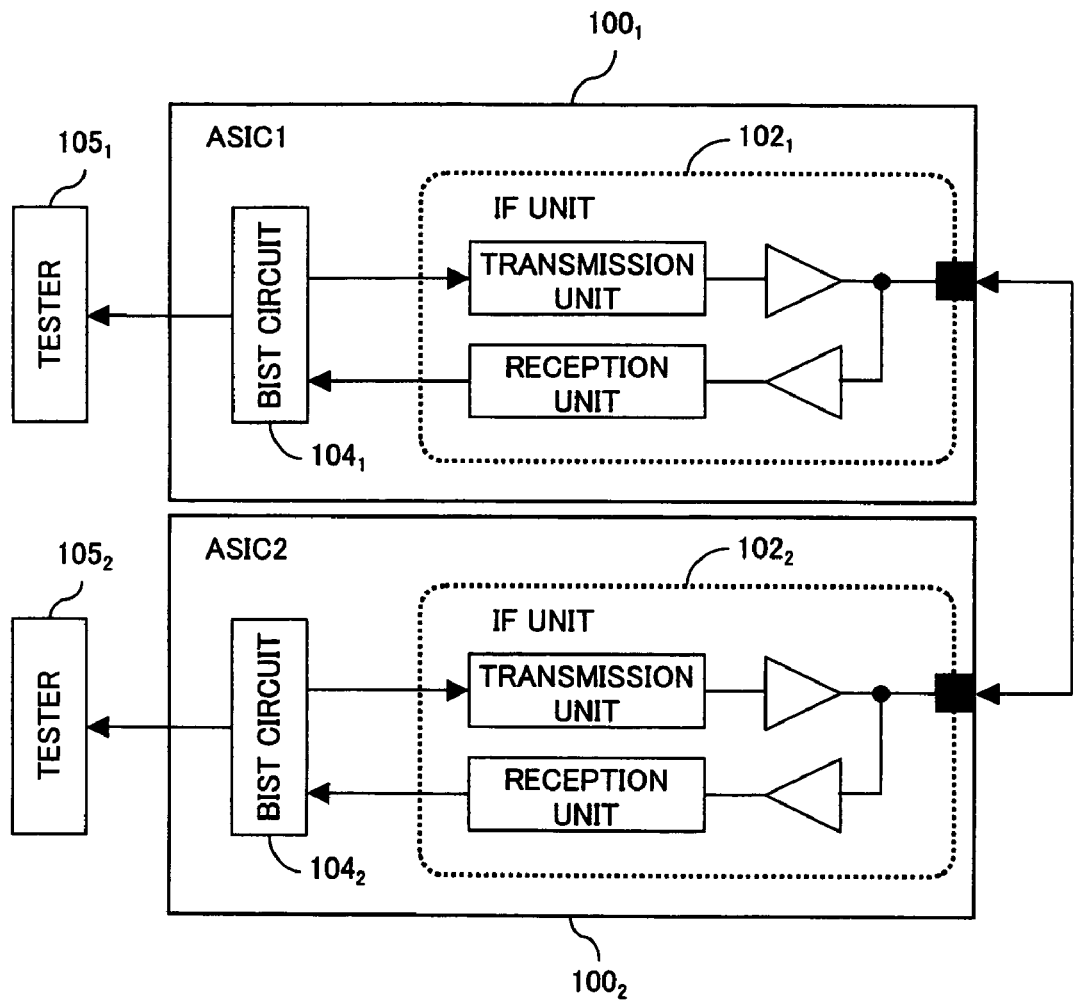
FIG. 6 is an explanatory view of the interface test system (2) according to the conventional technology shown in FIG. 4.
Figure 7:
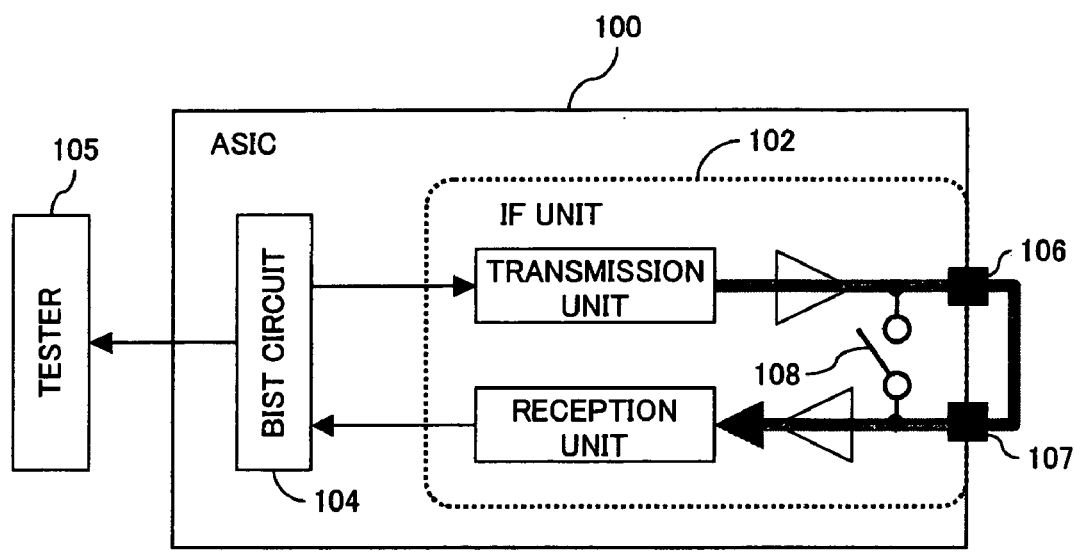
FIG. 7 is an explanatory view of the interface test system (3) according to the conventional technology shown in FIG. 4.
Figure 8:
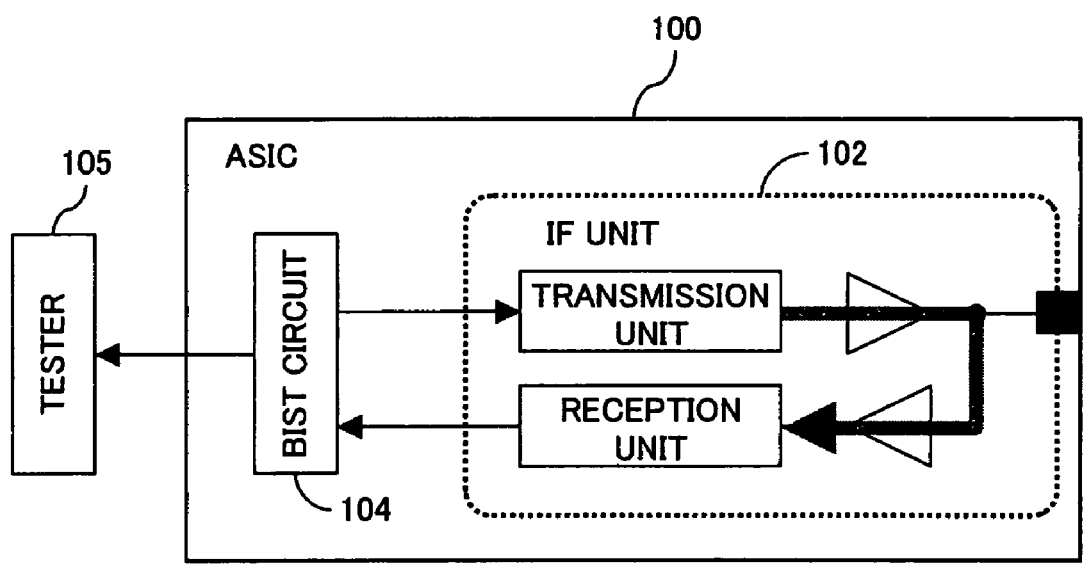
FIG. 8 is an explanatory view of the interface test system (4) according to the conventional technology shown in FIG. 4.

In this case, when a test result indicates a negative result, as explained by referring to FIG. 6, it is necessary to discriminate a faulty ASIC. However, the interface test system according to the present invention can be applied to an ASIC (LSI) having only one high-speed parallel interface. Thus, the present invention is practically valuable also in this point.

What is claimed is:

1. A semiconductor integrated circuit apparatus, comprising:
  a plurality of interfaces transmitting and receiving data;
  and an emulation control unit allowing any one of the plurality of interfaces to perform an operation of emulating an interface of a connection partner device in data transmission and reception, which has different interface operation specifications, wherein
  at least one interface of the plurality of interfaces is electrically connected with another interface of the plurality of interfaces, wherein at least one of the connected interfaces acts as a pseudo interface of the connection partner, and
  a test on an interface is performed, without providing an actual connection partner device for the test, by operating one of the plurality of interfaces provided in the semiconductor integrated circuit apparatus as the pseudo interface of the connection partner for performing a pseudo operation of an interface of the connection partner device when the connection partner device has different operation specifications than the interface.

2. The apparatus according to claim 1, wherein the emulation control unit is mounted in a built-in self-test circuit which is incorporated into the semiconductor integrated circuit apparatus and generates test data.

3. The apparatus according to claim 2, wherein when the interface which performs the emulating operation is located on a transmitting side of the test data, the emulation control unit outputs a transmission data selection directive signal for selection of transmission of the test data generated by the built-in self-test circuit to a data transmission unit in the interface.

4. The apparatus according to claim 3, wherein:
the emulation control unit outputs an emulating operation directive signal for the interface to a data transmission control unit in the interface;
and the data transmission control unit further outputs an output enable signal to a data transmission buffer with an output enable terminal in the data transmission unit.

5. The apparatus according to claim 2, wherein when the interface which performs the emulating operation is located on a receiving side of the test data, the emulation control unit issues a delay operation directive signal for delaying a data strobe signal to a data reception control unit in the interface to allow a data reception unit in the interface to use a signal obtained by delaying the data strobe signal transmitted from the test data transmitting side as a clock signal for latch of the test data to be received.

6. The apparatus according to claim 5, wherein the emulation control unit outputs a selection control signal, for selection of data latched by the data reception unit of the interface which performs the emulating operation, to a selector selecting data latched in one of two interfaces, corresponding to which of the two interfaces receives the test data.

7. The apparatus according to claim 1, wherein the interface is a high-speed parallel interface.

8. An interface test method for use by a semiconductor integrated circuit apparatus having a plurality of interfaces for performing data transmission and reception, comprising:
coupling two of the plurality of interfaces via a transmission line;
controlling one of the two interfaces to perform an operation of emulating an interface of a connection partner device, wherein the operation of emulating includes emulating a connection partner device which is electrically connectable to the semiconductor integrated circuit apparatus and which has different interface operation specifications;
allowing data to be transmitted and received between the interface f-m: performing the emulating operation and the other interface of the two interfaces;
performing a test on the other interface of the two interfaces without providing an actual connection partner device for the test, by operating the controlled interface as a pseudo interface for performing a pseudo operation of an interface of the connection partner device where the connection partner device has different operation specifications than the other interface; and
obtaining a test result of the interface, being the other interface of the two interfaces, depending on the data transmission and reception result.

9. The method according to claim 8, wherein the semiconductor integrated circuit apparatus comprises a built-in self-test circuit which is incorporated into the semiconductor integrated circuit apparatus and generates data;
and the data generated by the built-in self-test circuit is transmitted and received between the two interfaces.

10. The method according to claim 9, wherein when the interface which performs the emulating operation is located on a transmitting side of a test data, an emulation control unit which controls the emulating operation allows a data transmission unit in the interface which performs the emulating operation to select transmission of the test data generated by the built-in self-test circuit.

11. The method according to claim 10, wherein:
the emulation control unit outputs an emulating operation directive signal to a data transmission control unit in the interface which performs the emulating operation;
and the data transmission control unit further outputs an output enable signal to a data transmission buffer with an output enable terminal in the data transmission unit.

12. The method according to claim 9, wherein when the interface which performs the emulating operation is located on a receiving side of a test data, an emulation control unit which controls the emulating operation issues a delay operation directive signal for delaying a data strobe signal to a data reception control unit in the interface to allow a data reception unit in the interface to use a signal obtained by delaying the data strobe signal transmitted from the test data transmitting side as a clock signal for latch of the test data to be received.

13. The method according to claim 12, wherein the emulation control unit outputs a selection control signal, for selection of data latched by the data reception unit of the interface which performs the emulating operation, to a selector selecting data latched in one of two interfaces, corresponding to which of the two interfaces receives the test data.

14. The method according to claim 8, wherein the interface to be tested is a high-speed parallel interface.

15. An interface test method using first and second semiconductor integrated circuit apparatuses having a plurality of interfaces for data transmission and reception, comprising:
coupling interfaces of the first and second semiconductor integrated circuit apparatuses via a transmission line;
controlling an interface in the first semiconductor integrated circuit apparatus to perform an operation of emulating an interface having operation specifications different from operation specifications of the interface of the first semiconductor integrated circuit apparatus;
allowing data to be transmitted and received between the interface which performs the emulating operation and interfaces in the first and second semiconductor integrated circuit apparatuses;
performing a test on an interface, without providing a connection partner device for the test, by operating the controlled interface as a pseudo interface for performing a pseudo operation of an interface of the connection partner device where the connection partner device has different operation specifications than the interface; and
obtaining a result of the test depending on a result of transmission and reception of a test data.

* * * * *